(12) United States Patent
Kane

(10) Patent No.: US 11,731,870 B2
(45) Date of Patent: Aug. 22, 2023

(54) DEVICES, SYSTEMS, AND METHODS FOR OBTAINING SENSOR MEASUREMENTS

(71) Applicant: Canon Solutions America, Inc., Melville, NY (US)

(72) Inventor: Jeffrey David Kane, Boynton Beach, FL (US)

(73) Assignee: Canon Solutions America, Inc., Melville, NY (US)

( * ) Notice: Subject to any disclaimer, the term of this patent is extended or adjusted under 35 U.S.C. 154(b) by 323 days.

(21) Appl. No.: 16/999,020

(22) Filed: Aug. 20, 2020

(65) Prior Publication Data

US 2022/0055892 A1 Feb. 24, 2022

(51) Int. Cl.
*B81B 7/00* (2006.01)
*B81B 7/04* (2006.01)
*B41J 11/00* (2006.01)

(52) U.S. Cl.
CPC .......... *B81B 7/008* (2013.01); *B41J 11/0095* (2013.01); *B81B 7/04* (2013.01)

(58) Field of Classification Search
None
See application file for complete search history.

(56) References Cited

U.S. PATENT DOCUMENTS

| 6,826,607 B1 | 11/2004 | Gelvin | |
|---|---|---|---|
| 7,243,270 B2 | 7/2007 | Taniguchi | |
| 7,369,948 B1 | 5/2008 | Ferenczi | |
| 11,431,566 B2 * | 8/2022 | Kane | H04L 41/0816 |
| 2006/0209354 A1 * | 9/2006 | Saito | G06F 3/016 |
| | | | 358/406 |
| 2007/0242033 A1 * | 10/2007 | Cradick | G06F 3/0412 |
| | | | 345/156 |
| 2008/0109186 A1 | 5/2008 | Ferenczi | |
| 2009/0009829 A1 * | 1/2009 | Katsuyama | H04N 1/00827 |
| | | | 358/498 |
| 2009/0052912 A1 | 2/2009 | Soji | |
| 2012/0032283 A1 | 2/2012 | Frey | |
| 2013/0106808 A1 * | 5/2013 | Shiraishi | G06F 1/1694 |
| | | | 345/204 |
| 2018/0139517 A1 | 5/2018 | Schwartz | |

(Continued)

OTHER PUBLICATIONS

Kristofer S. J. Pister et al., Emerging Challenges: Mobile Networking for "Smart Dust", Journal of Communications and Networks, Nov. 2000.

(Continued)

*Primary Examiner* — Benjamin P Sandvik
(74) *Attorney, Agent, or Firm* — Canon U.S.A., Inc. IP Division

(57) ABSTRACT

Some embodiments of a device comprise an image-forming medium and one or more sensors that are attached to the image-forming medium. Also, in some embodiments, the image-forming medium is paper or a medium that has paper-like characteristics, at least some of the one or more sensors are microelectromechanical systems (MEMS), or the one or more sensors are configured to be powered by wireless power transfer. And some embodiments of the device further comprise a system-on-a-chip that is in communication with the one or more sensors, a transceiver that is in communication with the system-on-a-chip, or a radio-frequency identification (RFID) tag.

19 Claims, 16 Drawing Sheets

(56) References Cited

U.S. PATENT DOCUMENTS

2019/0324438 A1  10/2019 Cella
2020/0204883 A1  6/2020 Gang
2020/0226906 A1  7/2020 McKinley

OTHER PUBLICATIONS

Marisa Alia-Novobilski, AFRL, American Semiconductor create flexible system-on-chip for 'internet of things', Dec. 2017.
Azka Amin et al., Collaborative Wireless Power Transfer in Wireless Rechargeable Sensor Networks, Jun. 2020.
Shang Gao et al., Airborne Wireless Sensor Networks for Airplane Monitoring System, Wireless Communications and Mobile Computing, May 2018.
Berenger Ossete Gombe et al., A SAW Wireless Sensor Network Platform for Industrial Predictive Maintenance, Jun. 15, 2017.
Xinyu Liu et al., Paper-based piezoresistive MEMS sensors, Jul. 2011.
Saman Naderiparizi et al., WISPCam: A Battery-Free RFID Camera, Apr. 2015.
Adam B. Noel et al., Structural Health Monitoring Using Wireless Sensor Networks: A Comprehensive Survey, IEEE Communications Surveys & Tutorials, vol. 19, No. 3, Third Quarter 2017, Aug. 2017.
Pooja Rai et al., Wireless Sensor Network for Machine Health Monitoring, Mar. 2015.
Pooja Rai et al., Control and Monitoring Machine using Wireless Sensor Network, May 2015.
Alanson P. Sample et al., Analysis, Experimental Results, and Range Adaptation of Magnetically Coupled Resonators for Wireless Power Transfer, Jun. 2010.
Alanson P. Sample et al., Design of an RFID-Based Battery-Free Programmable Sensing Platform, Nov. 2008.
Dongjin Seo, Neural Dust: Ultrasonic Biological Interface, Electrical Engineering and Computer Sciences University of California at Berkeley, Dec. 1, 2018.
Joshua R. Smith et al., A Wirelessly-Powered Platform for Sensing and Computation, Sep. 2006.
Muhammad Syafrudin et al., Performance Analysis of IoT-Based Sensor, Big Data Processing, and Machine Learning Model for Real-Time Monitoring System in Automotive Manufacturing, Sep. 2018.
Ankit Tiwari et al., Energy-Efficient Wireless Sensor Network Design and Implementation for Condition-Based Maintenance, Mar. 2007.

* cited by examiner

DEVICES, SYSTEMS, AND METHODS FOR OBTAINING SENSOR MEASUREMENTS

BACKGROUND

Technical Field

The present disclosure relates generally to devices, systems, and methods for obtaining sensor measurements of a device or system, such as an image-forming device.

Background

Modern machines and systems utilize various built-in sensors to measure a number of properties, detect events or changes in an environment, and output information related to the measurements. For example, conventional image-forming devices (e.g., printers, copiers, multifunction peripherals) may include various built-in sensors to monitor aspects of the device.

SUMMARY

Some embodiments of a device comprise an image-forming medium and one or more sensors that are attached to the image-forming medium. And, in some embodiments, the image-forming medium is paper or another medium that has paper-like characteristics (e.g., some plastics).

Some embodiments of a method comprise feeding an image-forming medium, to which one or more sensors are attached, to an image-forming path of image-forming device and activating the one or more sensors.

Some embodiments of a system comprise an image-forming medium, wherein the image-forming medium includes one or more sensors; and a wireless-power generator that is configured to wirelessly supply power to the one or more sensors.

Further features of various embodiments will become apparent from the following description of exemplary embodiments with reference to the attached drawings, in which like reference characters designate the same or similar parts throughout the figures thereof.

DETAILED DESCRIPTION

Figure 1A:
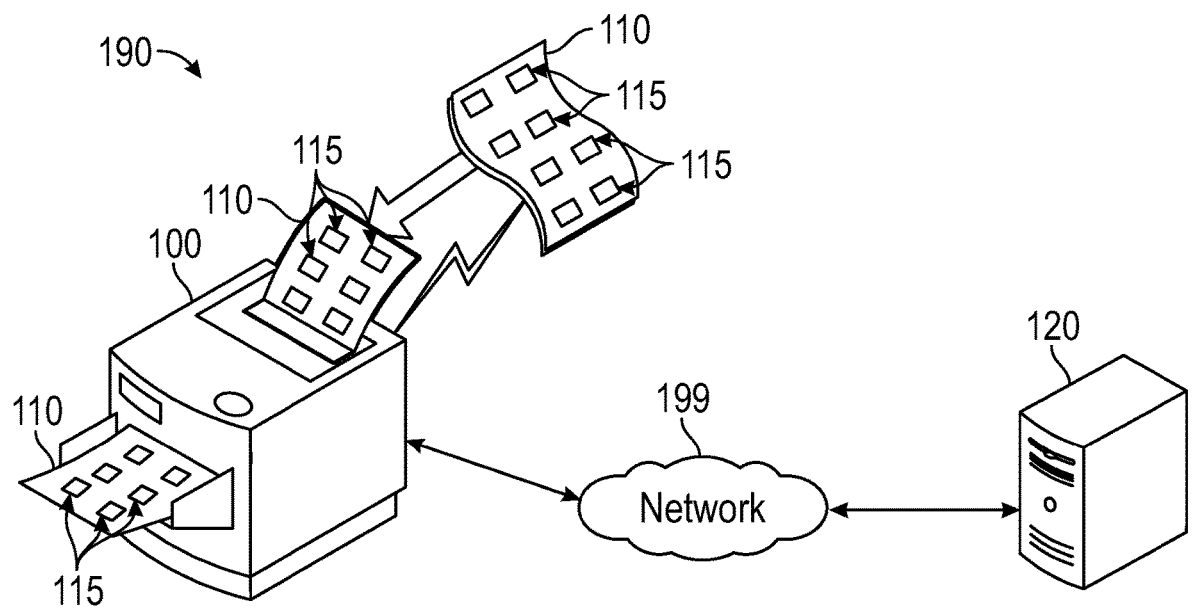
FIG. 1A illustrates an example embodiment of a system for obtaining sensor measurements of a device.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Additionally, in this description and the drawings, an alphabetic suffix on a reference number may be used to indicate a specific instance of the feature identified by the reference numeral. For example, the photosensitive drum cartridges in a group of photosensitive drum cartridges may be identified with the reference numeral 9 when a particular photosensitive drum cartridge is not being distinguished. However, 9Y may be used to identify a specific photosensitive drum cartridge when the specific photosensitive drum cartridge is being distinguished from the rest of the photosensitive drum cartridges 9.

FIG. 1A illustrates an example embodiment of a system 190 for obtaining sensor measurements of a device. The system 190 includes an image-forming device 100, a sensor-carrying medium 110, and one or more remote computing devices 120. In this embodiment, the image-forming device 100 and the one or more remote computing devices 120 communicate via one or more networks 199, which may include a wired network, a wireless network, a LAN, a WAN, a MAN, and a PAN. And the one or more networks 199 may include one or more dynamic self-configuring networks (e.g., an ad hoc network). Also, in some embodiments, the devices communicate via other wired or wireless channels.

The sensor-carrying medium 110 includes one or more sensors 115, and the sensor-carrying medium 110 is configured to travel through the image-forming device 100 along the path that an image-forming medium (e.g., paper) travels during an image-forming operation (e.g., printing, scanning). Thus, the sensor-carrying medium 110 is input into the image-forming device 100, travels through the image-forming device 100, and is output by the image-forming device 100. Also, the image-forming device 100 may wirelessly supply power to the one or more sensors 115, for example through radio-frequency-identification (RFID) or inductive transfer.

While the sensor-carrying medium 110 travels through the image-forming device 100, the one or more sensors 115 generate data ("sensed data") that describe measurements of a physical stimulus (e.g., heat, pressure, sound, vibration) or a chemical stimulus that are detected by the one or more sensors 115. In this embodiment, the sensed data is sent to the image-forming device 100, and the image-forming device 100 sends the sensed data to the one or more remote computing devices 120. Also, in some embodiments, the sensor-carrying medium 110 includes internal storage, and the sensed data is stored in the internal storage. And, in some embodiments, the image-forming device 100 stores the sensed data in its own storage.

Figure 1B:
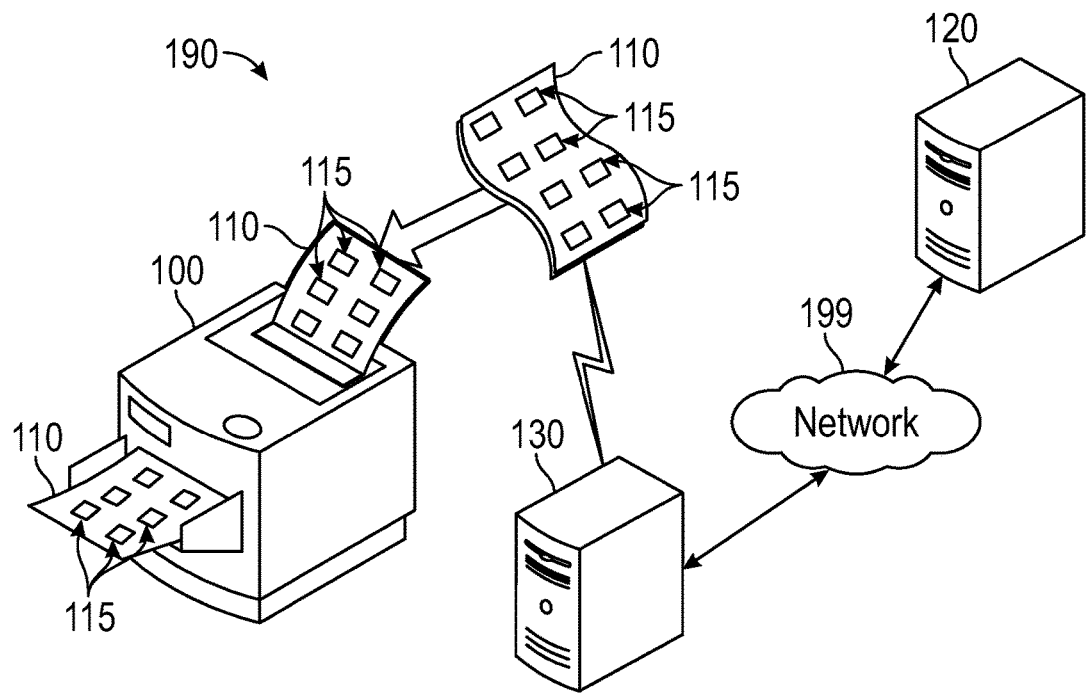
FIG. 1B illustrates an example embodiment of a system for obtaining sensor measurements of a device.

FIG. 1B illustrates an example embodiment of a system 190 for obtaining sensor measurements of a device. The system 190 includes an image-forming device 100, a sensor-carrying medium 110, one or more remote computing devices 120, and a sensor-communication device 130. In this embodiment, the sensor-communication device 130 and the one or more remote computing devices 120 communicate via one or more networks 199. Also, in some embodiments, the devices communicate via other wired or wireless channels.

In contrast to the embodiment in FIG. 1A, in the embodiment in FIG. 1B, the sensed data is sent to the sensor-communication device 130, and the sensor-communication device 130 sends the sensed data to the one or more remote computing devices 120. Also, in some embodiments, the image-forming device 100 wirelessly supplies power to the one or more sensors 115, and in some embodiments the sensor-communication device 130 wirelessly supplies power to the one or more sensors 115. In embodiments in which the sensor-communication device 130 wirelessly supplies power to the one or more sensors 115, the sensor-communication device 130 may need to be properly positioned relative to the image-forming device 100 (e.g., within a certain distance of the image-forming device 100).

Figure 2A:
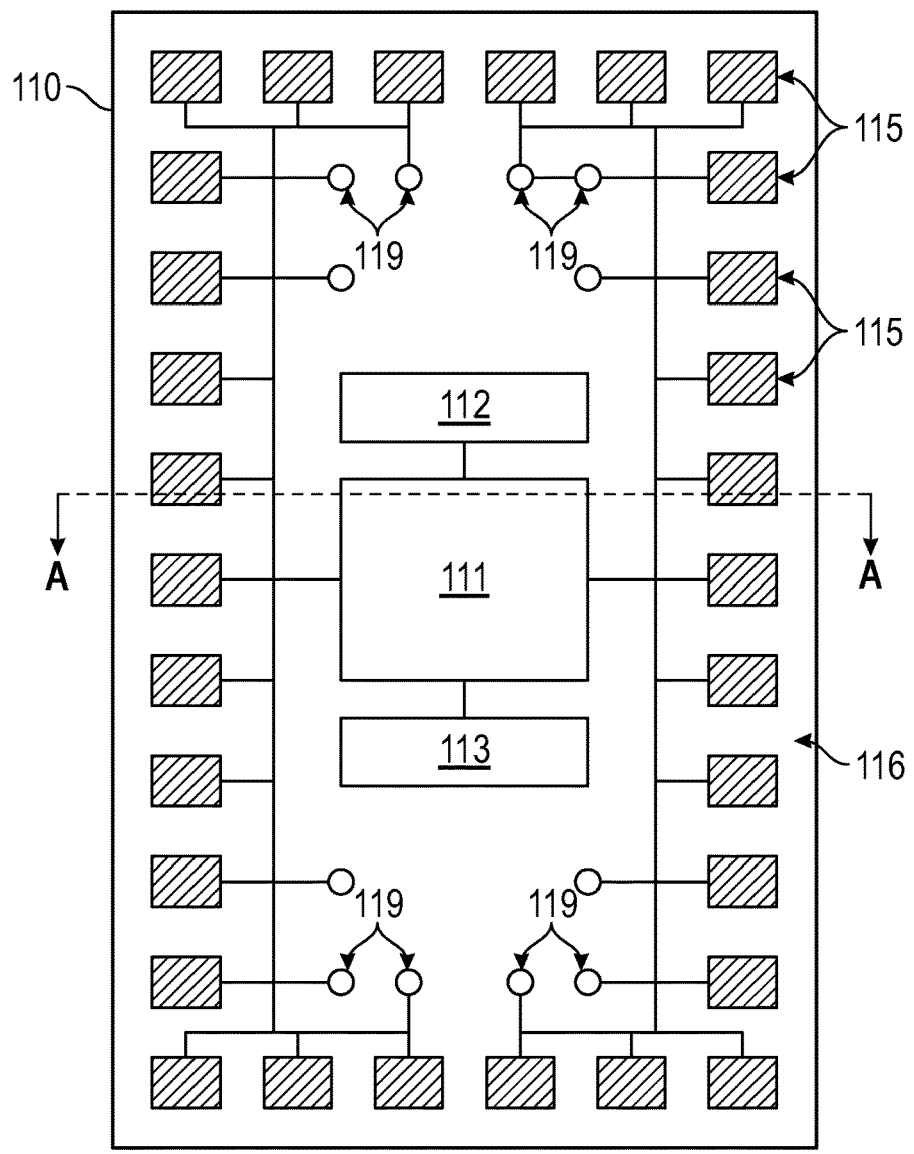
FIG. 2A illustrates an example embodiment of a sensor-carrying medium.

FIG. 2A illustrates an example embodiment of a sensor-carrying medium 110. The sensor-carrying medium 110 includes a plurality of sensors 115, a system on a chip (SoC) 111, a transceiver 112, a wireless-power receiver 113, and a plurality of LEDs 119, which may emit different colors. For example, the LEDs 119 may emit different colors and patterns of lights to communicate information (e.g., status information, diagnostic information) to a user. The sensor-carrying medium 110 also includes a base layer 116. The base layer 116 may be a flexible semiconductor substrate and may be the substrate of one or more of the other members of the sensor-carrying medium 110. Also, the base layer 116 may be or may include paper or another medium (e.g., some plastics, some silicones) that has paper-like characteristics (e.g., flexibility), which may allow the medium to travel along an image-forming path in a manner that is similar to paper.

In some embodiments, one or more of the sensors 115 are implemented in a respective wireless identification and sensing platform (WISP). Thus, the sensor-carrying medium 110 may include one or more WISPs. The SoC 111 includes at least one processor, memory (e.g., RAM, ROM) or other storage, and input or output ports. The transceiver 112 allows the SoC 111 to send data to, and receive data from, other devices, such as an image-forming device 100, a sensor-communication device 130, or another sensor-carrying medium 110. The transceiver 112 can use various protocols to send and receive data, for example Bluetooth Low Energy, Z-Wave, Zigbee, IEEE 802.11ah, and near-field communication (NFC).

The wireless-power receiver 113, which may include a power-reception antenna, is configured to receive wireless power that can be used to supply power to the sensors 115, the SoC 111, and the transceiver 112. For example, the wireless-power receiver 113 may use resonant inductive coupling to receive energy. Additionally, in some embodiments (e.g., embodiments that use WISPs to implement the sensors 115), the sensors 115 may be configured to receive their own wireless power, and thus do not require the wireless-power receiver 113 to supply their power.

The sensors 115 can include various types of sensors, for example the following: temperature sensors, vibration sensors, pressure sensors, gyroscopes, color sensors, light sensors (e.g., visible light, infrared light), humidity sensors, chemical sensors, and voltage sensors.

The sensors 115, the SoC 111, the transceiver 112, and the wireless-power receiver 113 are all flexible. In some embodiments, the sensors 115, the SoC 111, the transceiver 112, and the wireless-power receiver 113 are flex circuits. For example, some flex circuits use flexible plastic substrates or flexible silicon. Also, some flex circuits include a metallic layer of traces (e.g., copper) that are bonded to a dielectric layer (e.g., polyimide). The thickness of the metallic layer can vary: in some embodiments, the thickness is less than 0.0001", and in some embodiments the thickness is greater than 0.010". Also, the dielectric thickness can vary (e.g., from 0.0005" to 0.010"). And an adhesive may be used to bond the metal to the substrate, but other types of bonding, such as vapor deposition, can also be used to bond the metal to the substrate. Also, the sensors 115, the SoC 111, the transceiver 112, and the wireless-power receiver 113 may all be formed on a single flexible substrate. And, in some embodiments, the sensors 115, the SoC 111, the transceiver 112, and the wireless-power receiver 113 are not all formed on the same substrate. For example, the SoC 111, the transceiver 112, and the wireless-power receiver 113 may be formed on one substrate, and the sensors 115 may be divided among multiple (e.g., 4, 5, 6, 7, 8) substrates.

The flexibility of the components of the sensor-carrying medium 110 (including the sensors 115, the SoC 111, the transceiver 112, the wireless-power receiver 113, and any substrates) allows the components of the sensor-carrying medium 110 to travel along an image-forming path though the image-forming device 100 without being damaged. Thus, when the sensors 115 are powered, the sensors 115 can obtain measurements of the conditions in the image-forming device 100 as the sensor-carrying medium 110 travels through the image-forming device 100.

Also, in some embodiments, sensor-carrying media 110 can communicate with each other. For example, some embodiments of sensor-carrying media 110 can form an ad hoc network. The sensor-carrying media 110 may send sensed data and other information to each other.

Figure 2B:
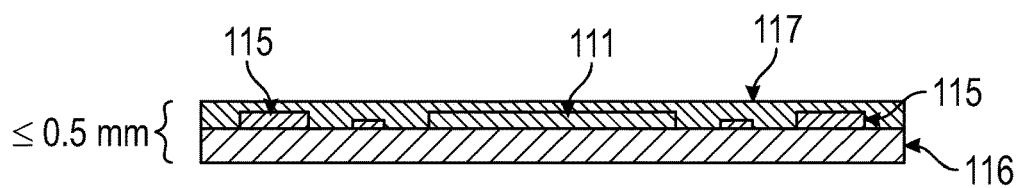
FIG. 2B illustrates an example embodiment of a sensor-carrying medium.

FIG. 2B illustrates an example embodiment of a sensor-carrying medium 110. FIG. 2B is a cut-away view of the embodiment of FIG. 2A on the line A-A. The sensor-carrying medium 110 also includes a coating layer 117. The coating layer 117 protects the sensors 115, the SoC 111, the transceiver 112, and the wireless-power receiver 113 as the sensor-carrying medium 110 travels through an image-forming device. Also, the coating layer 117 may repel ink or toner.

The thickness of the sensor-carrying medium 110 may be configured to allow the sensor-carrying medium to travel along an image-forming path. For example, in some embodiments, the thickness of the sensor-carrying medium 110 is equal to or less than 0.5 mm. Also for example, in some embodiments, the thickness of the sensor-carrying medium 110 is equal to or less than 2.0 mm.

Figure 2C:
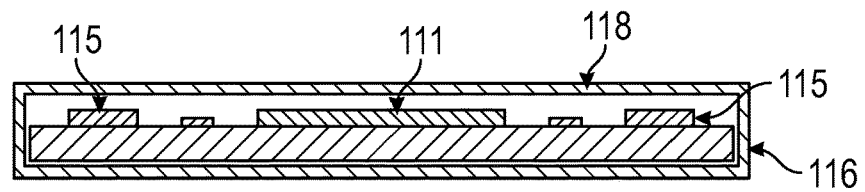
FIG. 2C illustrates an example embodiment of a sensor-carrying medium.

FIG. 2C illustrates an example embodiment of a sensor-carrying medium 110. FIG. 2C is a cut-away view of the embodiment of FIG. 2A on the line A-A. In this embodiment, the sensor-carrying medium 110 is surrounded by a body 118 (e.g., a sleeve, a case). As the sensor-carrying medium 110 travels through an image-forming device, ink or toner may be deposited on the body 118. The sensor-carrying medium 110 can be removed from the body 118, which may have ink or toner on it, and inserted into a new body 118, which may not have any ink or toner on it. Thus, ink and toner can effectively be removed from the sensor-carrying medium 110 by inserting the sensor-carrying medium 110 into a new body 118.

Figure 3A:
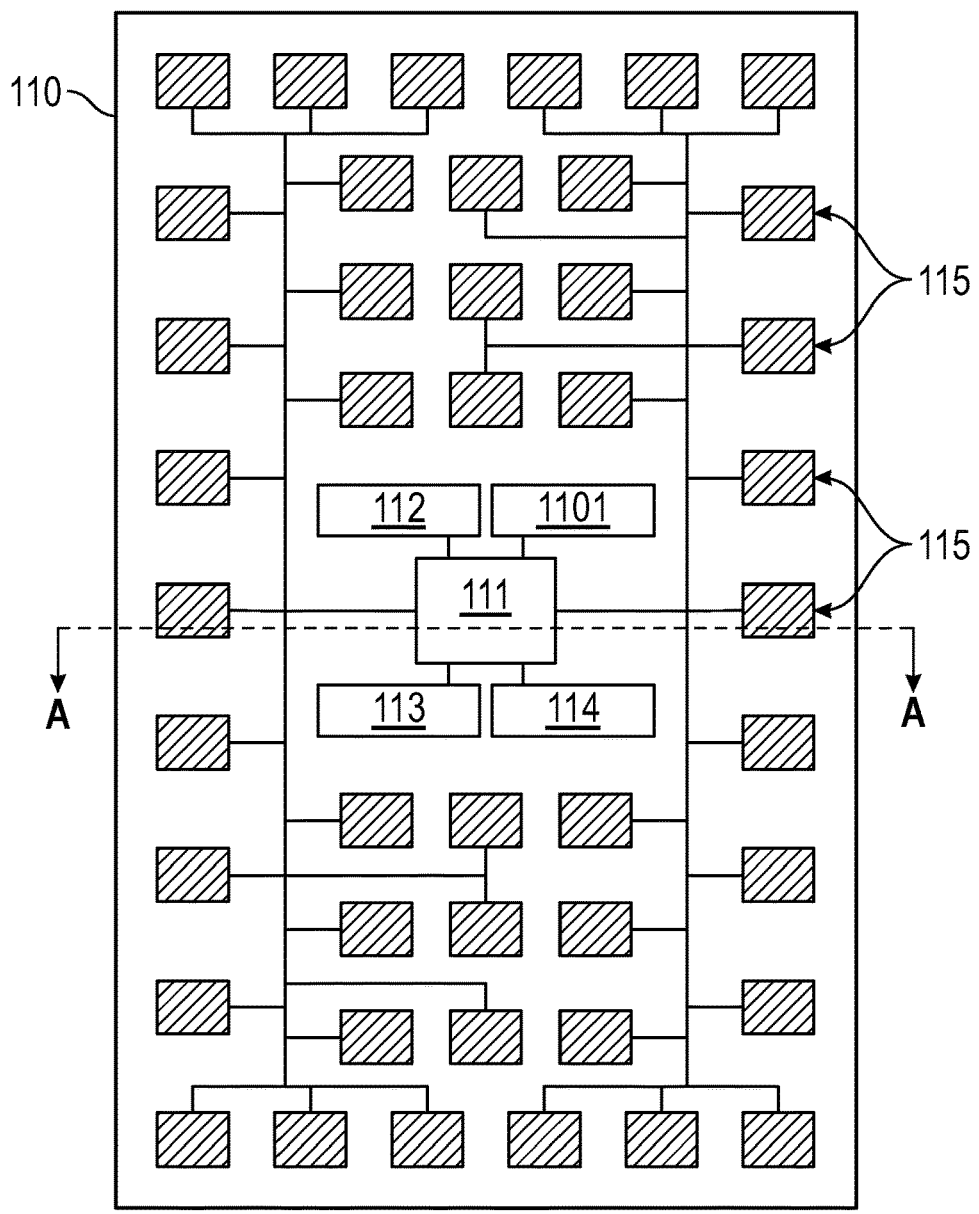
FIG. 3A illustrates an example embodiment of a sensor-carrying medium.

FIG. 3A illustrates an example embodiment of a sensor-carrying medium 110. The sensor-carrying medium includes sensors 115, a SoC 111, a transceiver 112, a wireless-power receiver 113, and a radio-frequency-identification (RFID) tag 114. As indicated by the differences between the number and placement of the sensors 115 in FIGS. 2A and 3A, various embodiments of the sensor-carrying medium 110 can include different numbers of sensors 115, and the sensors 115 may be positioned in different arrangements. The number and placement of the sensors 115 may be configured for a specific application or a specific image-forming device. Also, the number and placement of the sensors may depend on the ranges of the sensors 115.

The RFID tag 114 may transmit an identifier of the sensor-carrying medium 110. This can allow other devices and systems to distinguish between different sensor-carrying media 110. Also, some embodiments of the sensor-carrying medium 110 omit the wireless-power receiver 113 and wirelessly receive power through the RFID tag 114. In embodiments that do not include an RFID tag 114, other components (e.g., the SoC 111 and the transceiver) may be configured to transmit an identifier of the sensor-carrying medium 110.

Furthermore, as shown in FIG. 3A, the sensor-carrying medium 110 may include a battery 1101, such as a rechargeable lithium battery. Thus, the sensor-carrying medium 110 may be able to operate even when it does not receive wireless power. For example, the sensor-carrying medium 110 may charge the battery 1101 with received wireless power, and, when the supply of wireless power is stopped, operate using power that is supplied from the battery 1101.

Figure 3B:
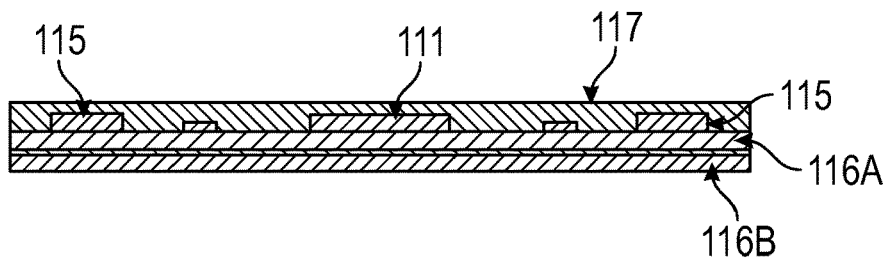
FIG. 3B illustrates an example embodiment of a sensor-carrying medium.

FIG. 3B illustrates an example embodiment of a sensor-carrying medium 110. FIG. 3B is a cut-away view of the embodiment of FIG. 3A on the line A-A. The sensor-carrying medium 110 includes a coating layer 117 and two base layers 116A-B. An upper base layer 116A may be the substrate of one or more other members of the sensory-carrying medium 110. The lower base layer 116B may support the upper base layer 116A or provide additional structural strength. The upper base layer 116A and the lower base layer 116B may be composed of different materials. For example, the upper base layer 116A maybe a semiconductor substrate, and the lower base layer 116B may be paper or may be a plastic or silicone that has paper-like characteristics that allow it to travel along an image-forming path in a manner that is similar to paper.

Figure 4:
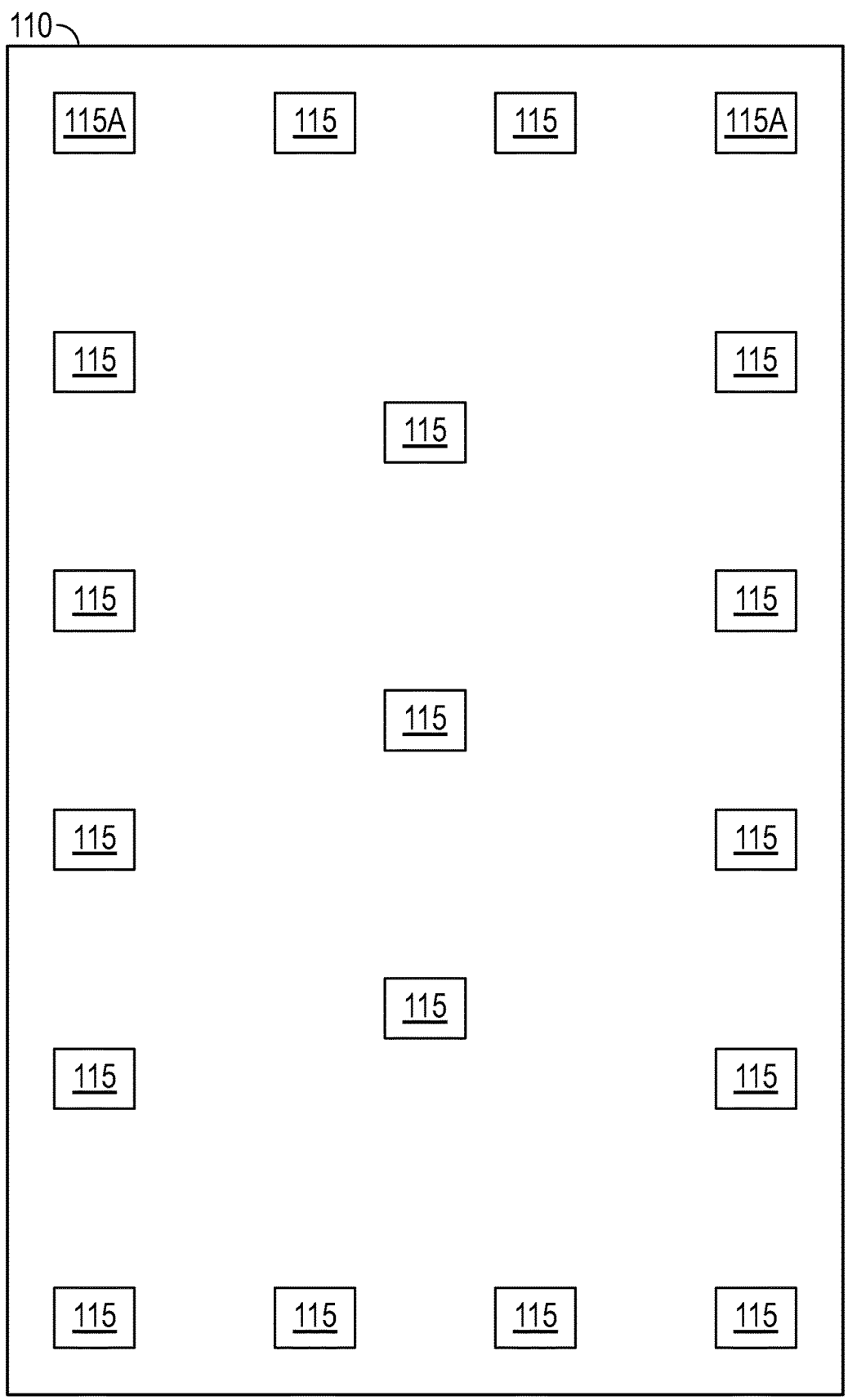
FIG. 4 illustrates an example embodiment of a sensor-carrying medium.

FIG. 4 illustrates an example embodiment of a sensor-carrying medium. In this embodiment, the sensor-carrying medium 110 includes a plurality of sensors 115. Additionally, the sensors 115 each include a respective processor and memory, and the processor and memory can be implemented in a microcontroller. And some embodiments of the sensors 115 include other specialized integrated-circuit components (e.g., application-specific integrated circuits) that are specially-configured to perform certain tasks. For example, in some embodiments, the sensors 115 are microelectromechanical systems (MEMS), such as a smartdust mote. And each of the sensors 115 may include a respective wireless-power receiver 113 or battery 1101. Thus, each sensor 115 may be configured to receive its own power, to store its own power, to store sensed data, and to transmit sensed data.

Also, the sensors 115 may be able to create and use an ad hoc network to communicate with each other. In some embodiments where the sensors 115 implement an ad hoc network, if some, but not all, of the sensors 115 can directly communicate with a transceiver or receiver that receives sensed data, then the sensors 115 that cannot directly communicate with the transceiver or receiver can transmit sensed data to the transceiver or receiver via the other sensors 115 in the ad hoc network.

Figure 5:
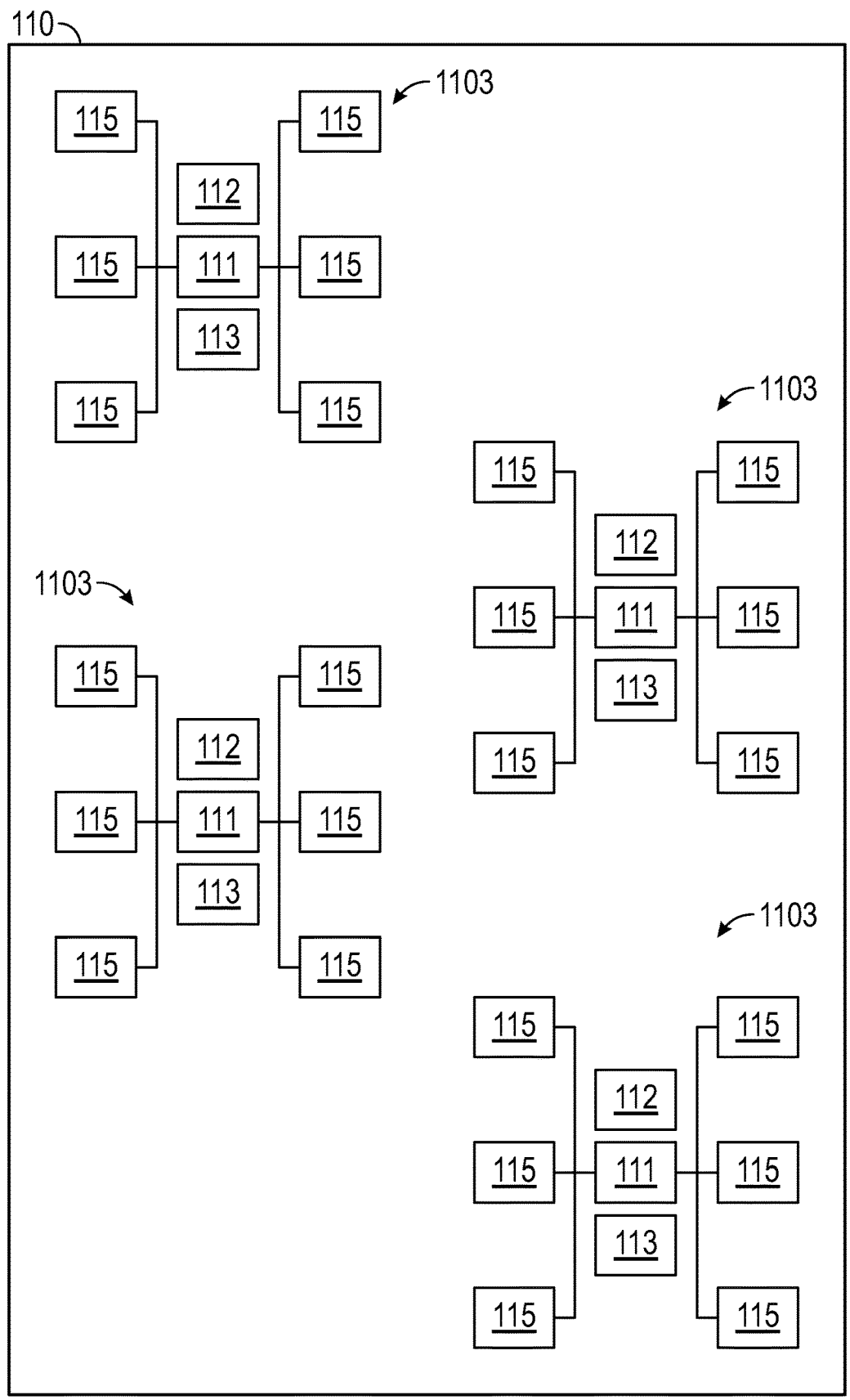
FIG. 5 illustrates an example embodiment of a sensor-carrying medium.

FIG. 5 illustrates an example embodiment of a sensor-carrying medium. In this embodiment, the sensor-carrying medium 110 includes four sensor groups 1103. Each sensor group 1103 includes a plurality of sensors 115, a SoC 111, a transceiver 112, and a wireless-power receiver 113.

Figure 6:
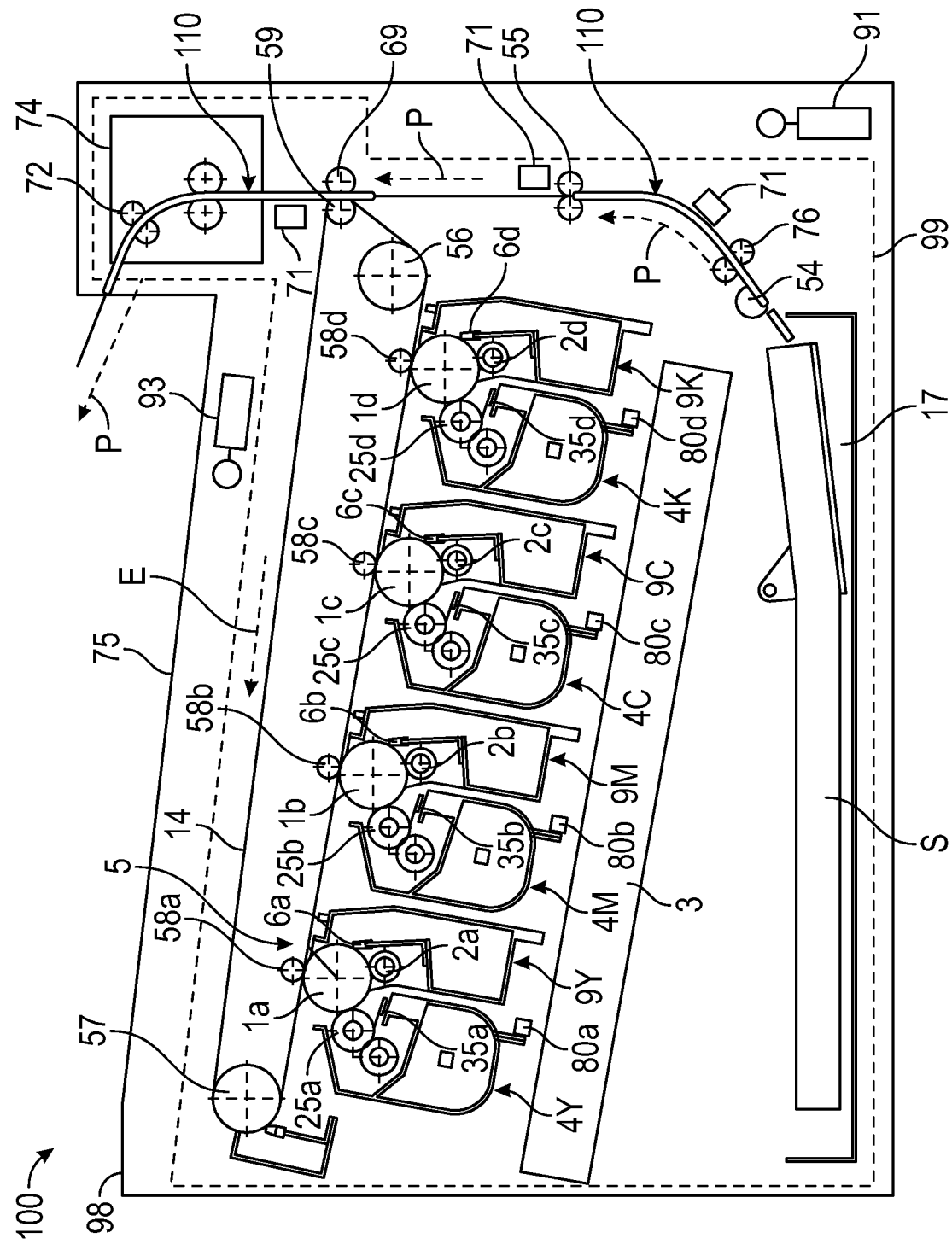
FIG. 6 illustrates a cut-away view of an example embodiment of an image-forming device.

FIG. 6 illustrates a cut-away view of an example embodiment of an image-forming device. The image-forming device 100 includes four photosensitive drum cartridges 9 (9Y, 9M, 9C, 9K), which are attachable to and detachable from a main body 98 of the image-forming device 100. Additionally, the image-forming device 100 includes four developing devices 4 (4Y, 4M, 4C, 4K). The developing devices 4 may be developing cartridges. The drum cartridges 9 and the developing devices 4 are detachably attached to the main body 98 by attachment members (not illustrated).

Each drum cartridge 9 includes a photosensitive drum 1 (1a, 1b, 1c, 1d). Around the photosensitive drum 1, process units, such as a charging roller 2 (2a, 2b, 2c, 2d) and a cleaning member 6 (6a, 6b, 6c, 6d), are placed in an integrated manner.

Each developing device 4 (4Y, 4M, 4C, 4K) includes a developing roller 25 (25a, 25b, 25c, 25d). Process units, such as a developing blade 35 (35a, 35b, 35c, 35d), are placed around the developing roller 25 in an integrated manner.

The charging roller 2 uniformly charges the surface of the photosensitive drum 1. The developing roller 25 abuts the photosensitive drum 1 and develops an electrostatic latent image formed on the photosensitive drum 1, using a developer (e.g., toner), so that the electrostatic latent image is visualized as a toner image. Then the cleaning member 6 removes the toner remaining on the photosensitive drum 1 after the toner image formed on the photosensitive drum 1 is transferred onto another medium, such as an image-forming medium S (which may be a sensor-carrying medium).

Also, a scanner unit 3 is located below the drum cartridges 9 and the developing devices 4 in the main body 98. The scanner unit 3 is an exposure device for selectively exposing the photosensitive drums 1 based on image information, to form electrostatic latent images on the photosensitive drums 1.

A media repository 17 (e.g., a cassette), which stores image-forming media S, is located in a lower portion of the main body 98. An image-forming-medium-conveying unit is provided to convey the image-forming media S along an image-forming path P to an upper portion of the main body 98 through a secondary transfer roller 69 and a fixing unit 74. The image-forming-medium-conveying unit includes a feed roller 54, a conveying roller pair 76, and a registration roller pair 55. The feed roller 54 separates the image-forming media S in the media repository 17 and feeds the image-forming media S one by one. The conveying roller pair 76 conveys the fed image-forming medium S. The registration roller pair 55 synchronizes the image-forming medium S with electrostatic latent images formed on the photosensitive drums 1. Also, position sensors 71, which detect the position of an image-forming medium (e.g., a leading edge of an image-forming medium, a trailing edge of an image-forming medium) are located along the image-forming path.

Additionally, above the drum cartridges 9 and the developing cartridges 4, the image-forming device 100 includes an intermediate transfer unit 5 for transferring toner images formed on the respective photosensitive drums 1 (1a, 1b, 1c, 1d). The intermediate transfer unit 5 includes a driving roller 56, a driven roller 57, primary transfer rollers 58 (58a, 58b, 58c, 58d) at positions opposed to the photosensitive drums 1 of the respective colors, and an opposed roller 59 at a position opposed to the secondary transfer roller 69. A transfer belt 14 as an intermediate transfer member is stretched around these rollers. The transfer belt 14 circularly moves in the direction of arrow E so as to be opposed to and in contact with all the photosensitive drums 1. Voltage is applied to the primary transfer rollers 58 (58a, 58b, 58c, 58d), so that the toner images are primarily transferred from the photosensitive drums 1 onto the transfer belt 14. Then, voltage is applied to the opposed roller 59, which is placed within the transfer belt 14, and the secondary transfer roller 69, so that the toner on the transfer belt 14 is transferred onto an image-forming medium S.

During image formation, the photosensitive drums 1 are rotated, and the scanner unit 3 selectively exposes the photosensitive drums 1, which have been uniformly charged by the charging rollers 2. Consequently, electrostatic latent images are formed on the photosensitive drums 1 and developed by the developing rollers 25. Toner images of the respective colors are thus formed on the photosensitive drums 1. In synchronization with this image formation, the registration roller pair 55 conveys an image-forming medium S along the image-forming path P to a secondary transfer position where the opposed roller 59 and the secondary transfer roller 69 abut each other through the transfer belt 14. Then, transfer bias voltage is applied to the secondary transfer roller 69, so that the toner images of the respective colors on the transfer belt 14 are secondarily transferred onto the image-forming medium S. A color image is thus formed on the image-forming medium S. The image-forming medium S on which the color image is formed is heated and pressurized by the fixing unit 74, so that the toner image is fixed. Then, the image-forming medium S is discharged to a discharge portion 75 by discharge rollers 72. The fixing unit 74 is provided in an upper portion of the main body 98.

Furthermore, below each developing cartridge 4, the image-forming device 100 includes a respective biasing member 80 (80a, 80b, 80c, 80d), which causes the developing roller 25, which is held in the developing cartridge 4, to abut the photosensitive drum 1.

Also, the aforementioned components of the image-forming device 100 are members of an image-forming unit 99.

Additionally, the image-forming device 100 includes at least one wireless-power transmitter 91. The wireless-power transmitter 91 is configured to wirelessly supply power to one or more sensor-carrying media 110, which may, for example, receive the power via a wireless-power receiver 113 or an RFID tag 114. FIG. 6 illustrates sensor-carrying media 110 at two locations on the image-forming path P. The wireless-power transmitter 91 may be positioned in the main body 98 to allow the wireless-power transmitter 91 to more efficiently supply power to the sensor-carrying media 110, for example near the image-forming path P. Also, while the sensor-carrying media 110 travel along the image-forming path P, the wireless-power transmitter 91 may continuously or intermittently supply power to the sensor-carrying media 110.

And this embodiment of the image-forming device 100 includes at least one transceiver 93 (or receiver). The transceiver 93 receives data (e.g., sensed data) from the transceiver 112 (or RFID tag 114) of the sensor-carrying medium 110. In some embodiments, the transceiver 93 continually or continuously receives data from the transceiver 112 of a sensor-carrying medium 110 while the sensor-carrying medium 110 travels along the image-forming path P. And, in some embodiments, the transceiver 93 receives data from the transceiver 112 (or RFID tag 114) of the sensor-carrying medium 110 only after the sensor-carrying medium 110 has finished traveling the image-forming path P.

While the sensor-carrying medium 110 has power (e.g., received power, stored power) and travels along the image-forming path P, the sensors 115 of the sensor-carrying medium 110 can obtain measurements of the conditions inside the image-forming device 100 and generate sensed data that describe the measurements. Also, different sensor-carrying media 110 may include different sensors or different arrangements of sensors. This can allow an operator or device to change the sensors that are used in the image-forming device 100 without modifying the image-forming device 100. Furthermore, the sensor-carrying medium 110 may dynamically adjust the sensors (e.g., calibration, thresholds, sensitivity) that it uses to generate sensed data while the sensor-carrying medium 110 is traveling through the image-forming device 100.

The image-forming device 100 may also be configured to perform a medium-conveying process that conveys the sensor-carrying medium 110 along the image-forming path without applying any toner or ink to the sensor-carrying medium 110.

Additionally, if the senor-carrying medium 110 is powered by, and communicates with, a device that is not the image-forming device 100 (e.g., a sensor-communication device), then sensor data can be obtained from an image-forming device 100 even if the image-forming device 100 does not include any sensors, any wireless power supply, and any transceiver that can communicate with the sensor-carrying medium 110. Thus, sensor data can be obtained from an image-forming device 100 even if the image-forming device 100 has very limited capabilities.

Figure 7:
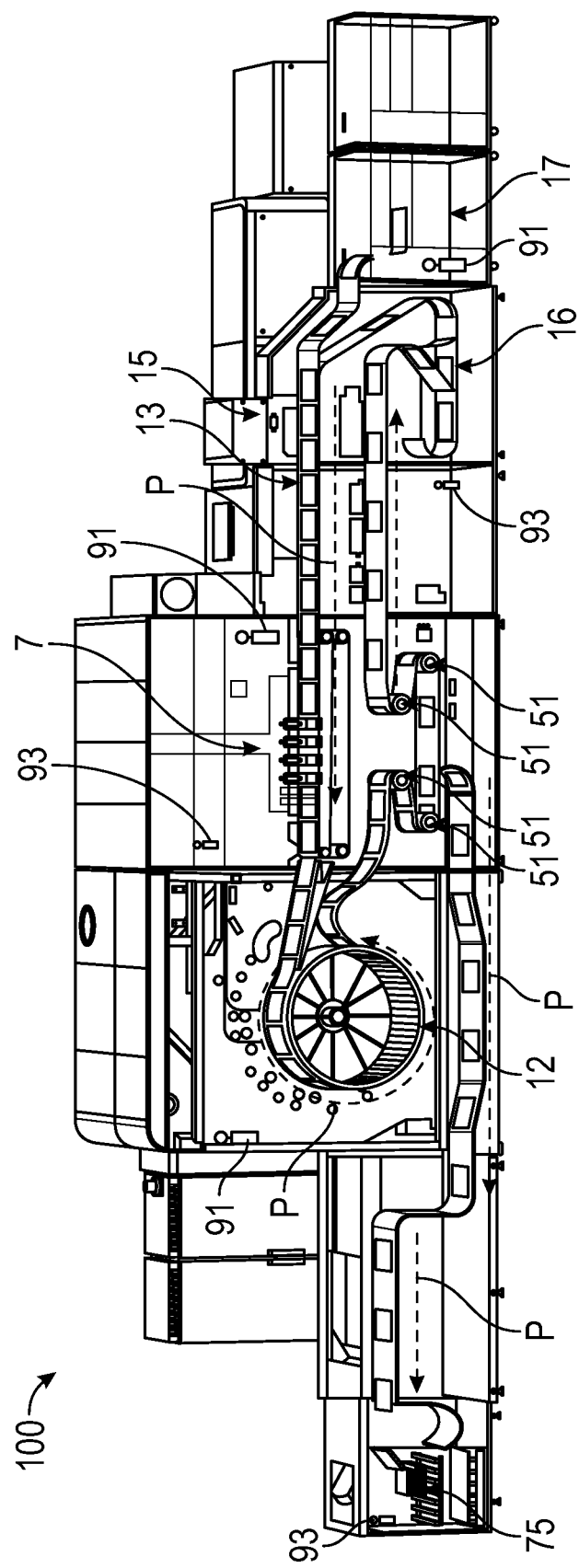
FIG. 7 illustrates a cut-away view of an example embodiment of an image-forming device.

FIG. 7 illustrates a cut-away view of an example embodiment of an image-forming device. The image-forming device 100 includes one or more print heads 7 (e.g., inkjet print heads), a drying station 12, a transport belt 13, and inspection station 15, a duplex switch 16, a media repository 17, a discharge portion 75, wireless-power transmitters 91, and transceivers 93. The drying station 12 dries the ink that has been applied to the media, and the drying station 12 may use multiple drying techniques. The transport belt 13 conveys media on an image-forming path P. Also, the transport belt 13 may use vacuum suction to hold the media flat. The inspection station 15 inspects the media as they travel by, detects media that have imperfections, and discards media that have imperfections. The duplex switch 16 adjusts the image-forming path P to enable or disable duplex printing.

In image-forming devices that have long image-forming paths, such as the image-forming device 100 in FIG. 7, multiple sensor-carrying media can simultaneously travel along the image-forming path P, interspersed among other image-forming media.

Figure 8:
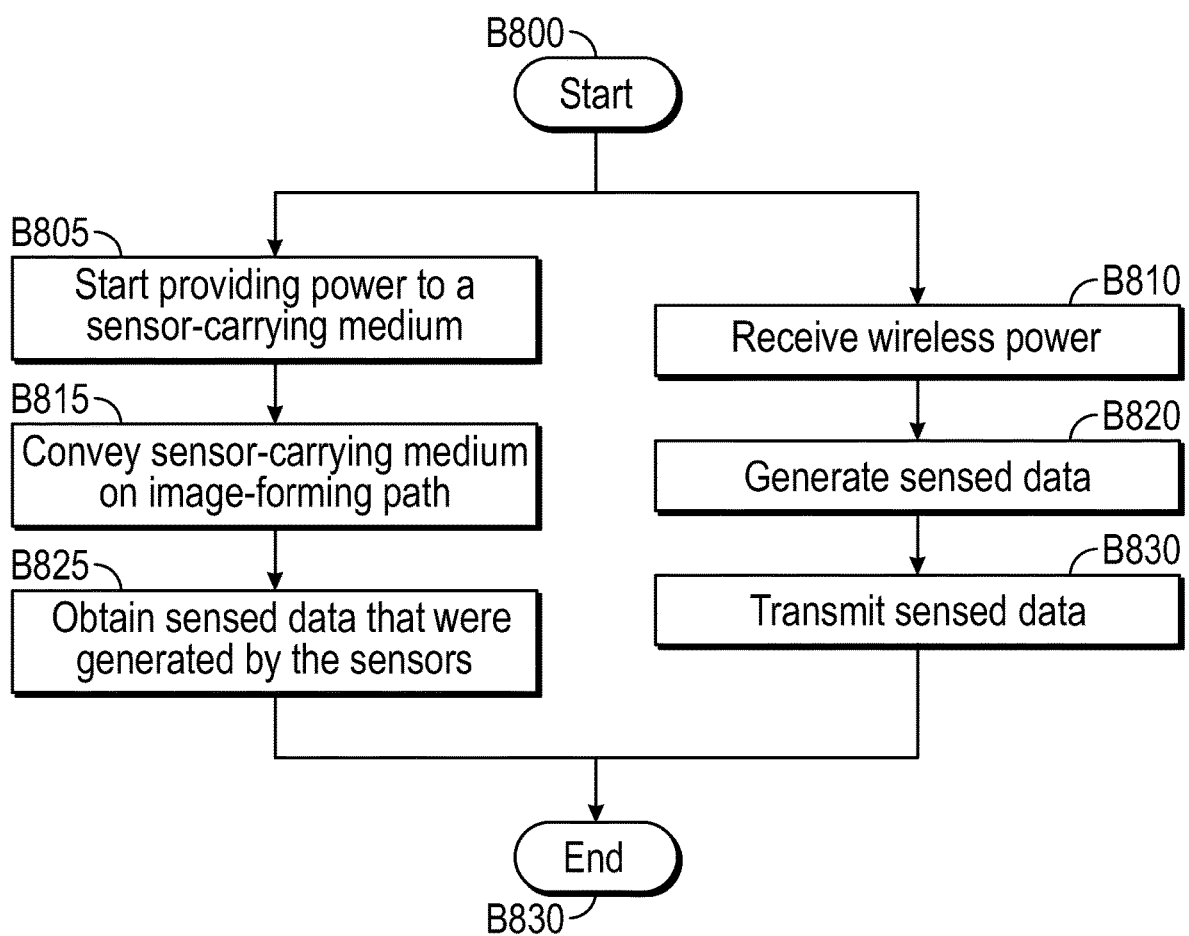
FIG. 8 illustrates an example embodiment of an operational flow for obtaining sensor data.

FIG. 8 illustrates an example embodiment of an operational flow for obtaining sensor data. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, interleaved, synchronous, and asynchronous orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

The flow starts in block B800 and then splits into a first flow and a second flow, at least some of which may be simultaneously executed. The first flow moves to block B805, where an image-forming device starts to provide wireless power to a sensor-carrying medium. For example, the image-forming device may activate a wireless-power transmitter that transmits power to the sensor-carrying medium. In some embodiments, block B805 is performed by a sensor-communication device. Next, in block B815, the image-forming device feeds a sensor-carrying medium on an image-forming path. The first flow then proceeds to block B825, where the image-forming device obtains sensed data that were generated by the sensors of the sensor-carrying medium. In some embodiments, block B825 is performed by a sensor-communication device. The first flow then moves to block B830.

From block B800, the second flow moves to block B810, where a sensor-carrying medium receives wireless power. For example, one or more wireless-power receivers may receive wireless power, or one or more RFID tags may receive wireless power, thereby powering the other components of the sensor-carrying medium. In response to receiving the wireless power, the components of the sensor-carrying medium (e.g., a SoC, one or more sensors, a transceiver, an RFID tag) may activate. Also, the components of the sensor-carrying medium (e.g., a SoC, one or more sensors, a transceiver) may perform initialization operations, such as sensor calibration and clock setting.

The second flow then moves to block B820, where the sensors generate sensed data based on detected physical or chemical stimuli. Each sensed data may include a respective time stamp. Also, the sensor-carrying medium stores the sensed data in storage. Then, in block B830, the sensor-carrying medium (e.g., via the transceiver, via the RFID tag) transmits the sensed data to the image-forming device (e.g., via a transceiver of the image-forming device) or a sensor-communication device. The second flow then moves to block B830.

The first flow and the second flow both end in block B830. In block B830, the image-forming device (or the sensor-communication device) may stop supplying wireless power to the sensor-carrying medium. Also, the sensor-carrying medium may perform power-down operations.

Figure 9:
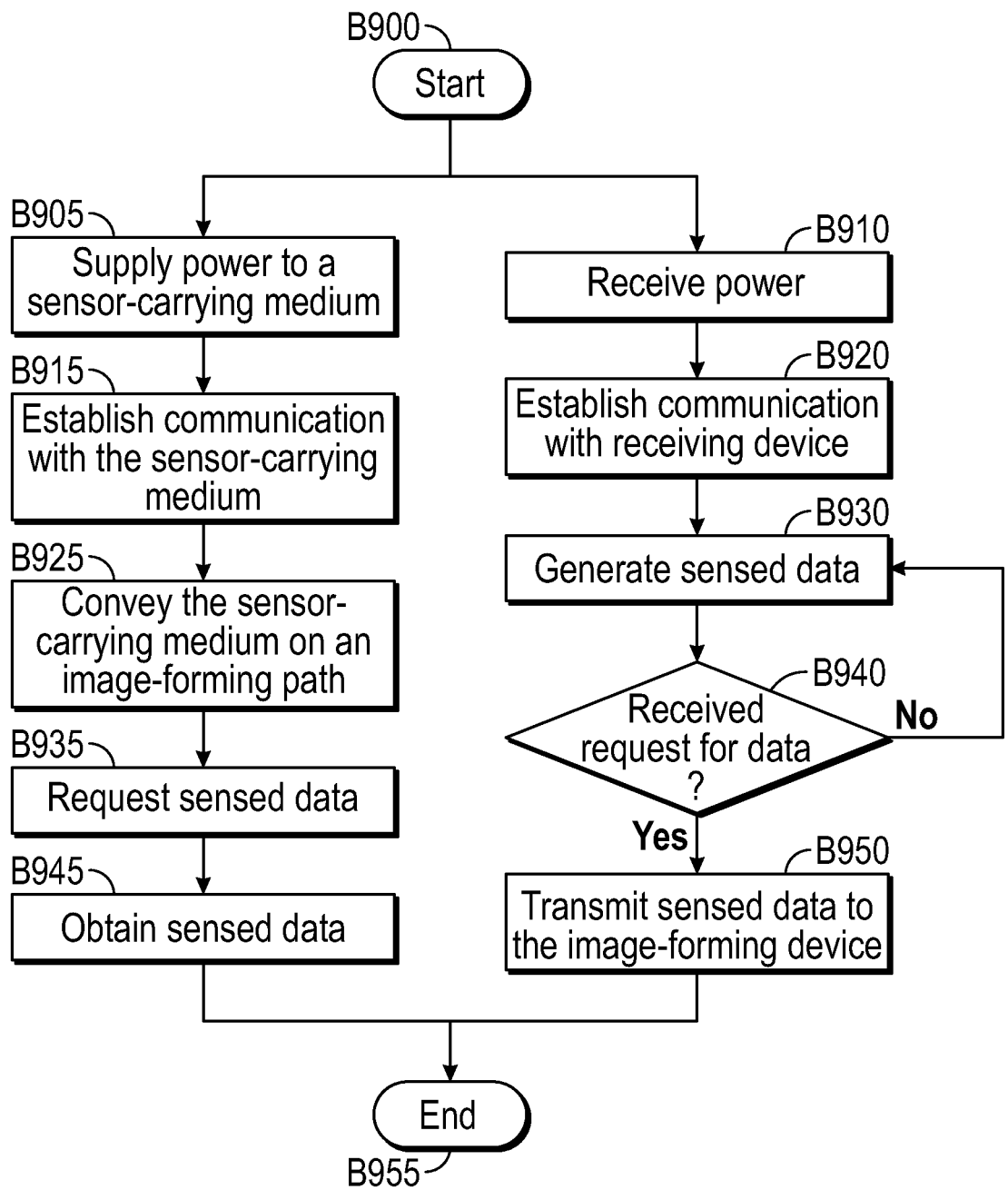
FIG. 9 illustrates an example embodiment of an operational flow for obtaining sensor data.

FIG. 9 illustrates an example embodiment of an operational flow for obtaining sensor data. The flow starts in block B900 and then splits into a first flow and a second flow.

The first flow moves to block B905, where an image-forming device wirelessly supplies power to a sensor-carrying medium. In some embodiments, the image-forming device continuously or intermittently supplies power to the sensor-carrying medium from blocks B905 to B945. And, in some embodiments, the image-forming devices discontinues the supply of power (e.g., in block B915, in block B925) and does not resume the supply of power through block B955. Then, in block B915, the image-forming device establishes communication with the sensor-carrying medium (e.g., with a SoC, with one or more sensors). Next, in block B925, the image-forming device conveys (e.g., feeds) the sensor-carrying medium on an image-forming path. The first flow then proceeds to block B935, where the image-forming device requests sensed data from the sensor-carrying medium. The first flow then advances to block B945, where the image-forming device obtains the sensed data from the sensor-carrying medium.

Also, in some embodiments, one or more of blocks B905, B915, B935, and B945 are performed by a sensor-communication device. Additionally, in some embodiments, in block B925 the image-forming device starts conveying the sensor-carrying medium on the image-forming path in response to receiving a message (e.g., an instruction) from a sensor-communication device.

From block B900, the second flow moves to block B910, where the sensor-carrying medium receives power. In some embodiments, the sensor-carrying medium continuously receives wireless power from blocks B910 to B950. And, in some embodiments, the sensor-carrying medium receives wireless power only part of the time (e.g., intermittently, during an initial period of time) from blocks B910 to B950, uses the wireless power to charge one or more batteries, and operates using the power from the batteries when the sensor-carrying medium is not receiving the wireless power.

Then, in block B920, the sensor-carrying medium establishes communication with the image-forming device. Blocks B915 and B920 are performed concurrently. The second flow then proceeds to block B930, where the sensor-carrying medium generates and stores sensed data. And, for at least some time, block B930 is performed concurrently with block B925. The second flow then moves to block B940, where the sensor-carrying medium determines whether a request for sensed data has been received. If a request for sensed data has not been received (B940=No), then the second flow returns to block B930. If a request for sensed data has been received (B940=Yes), then the second flow moves to block B950. In block B950, the sensor-carrying medium transmits sensed data to the image-forming device (or the sensor-communication device). And, for at least some time, block B950 is performed concurrently with block B945. The second flow then proceeds to block B955.

In block B955, the first flow and the second flow both end.

Thus, in FIG. 9, the sensor-carrying medium stores the sensed data and does not transmit the sensed data to another device until a request has been received.

Figure 10:
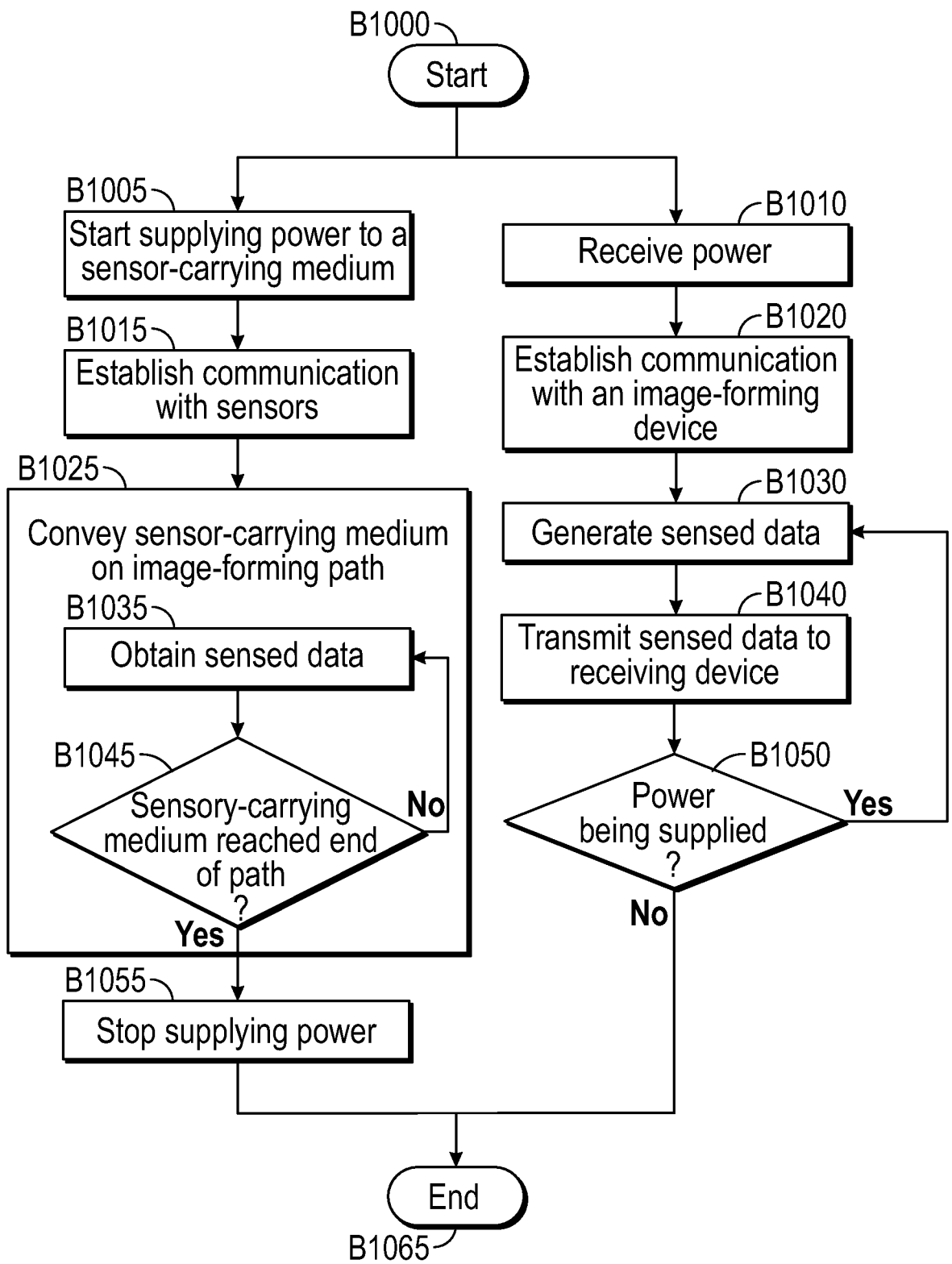
FIG. 10 illustrates an example embodiment of an operational flow for obtaining sensor data.

FIG. 10 illustrates an example embodiment of an operational flow for obtaining sensor data. The flow starts in block B1000 and then splits into a first flow and a second flow.

The first flow moves to block B1005, where an image-forming device wirelessly supplies power to a sensor-carrying medium. Then, in block B1015, the image-forming device establishes communication with the sensor-carrying medium (e.g., with a SoC, with one or more sensors). Next, in block B1025, the image-forming device conveys the sensor-carrying medium on an image-forming path. Also, block B1025 includes blocks B1035 and B1045, which are performed while the image-forming device conveys the sensor-carrying medium on the image-forming path. In block B1035, the image-forming device obtains sensed data from the sensor-carrying medium. In some embodiments, in block B1035 the image-forming device sends requests for sensed data to the sensor-carrying medium. In block B1045, the image-forming device determines whether the sensor-carrying medium has reached the end of the image-forming path. If the image-forming device determines that the sensor-carrying medium has not reached the end of the image-forming path (B1045=No), then the flow returns to block B1035. If the image-forming device determines that the sensor-carrying medium has reached the end of the image-forming path (B1045=Yes), then the first flow proceeds to block B1055. In block B1055, the image-forming device stops supplying power to the sensor-carrying medium, and then the first flow ends in block B1065.

Also, in some embodiments, one or more of blocks B1005, B1015, B1035, B1045, and B1055 are performed by a sensor-communication device. Additionally, in some embodiments, in block B1025 the image-forming device starts conveying the sensor-carrying medium on the image-forming path in response to receiving a message (e.g., an instruction) from a sensor-communication device.

From block B1000, the second flow moves to block B1010, where the sensor-carrying medium receives power. Then, in block B1020, the sensor-carrying medium establishes communication with the image-forming device (or a sensor communication device). Blocks B1015 and B1020 are performed concurrently. The second flow then proceeds to block B1030, where the sensor-carrying medium generates sensed data. The second flow then moves to block B1040, where the sensor-carrying medium transmits sensed data to the image-forming device (or a sensor-communication device). Next, in block B1050, if power is being supplied to the sensor-carrying medium (B1050=Yes), then the flow returns to block B1030. And, for at least some time, blocks B1030-B1050 are performed concurrently with block B1025. If in block B1050 power is not being supplied to the sensor-carrying medium (B1050=No), then the second flow ends in block B1065.

Figure 11:
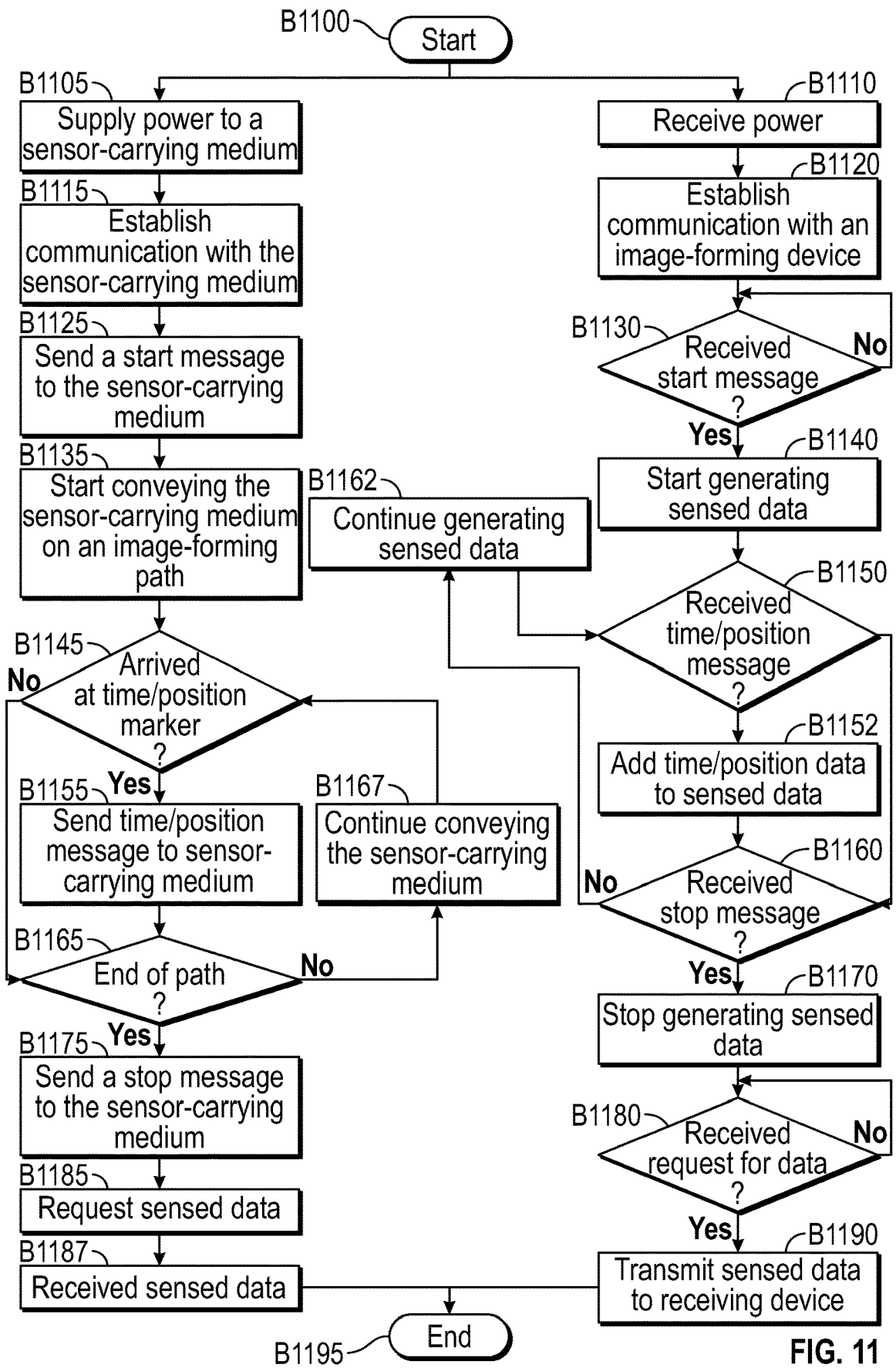
FIG. 11 illustrates an example embodiment of an operational flow for obtaining sensor data.

FIG. 11 illustrates an example embodiment of an operational flow for obtaining sensor data. The flow starts in block B1100 and then splits into a first flow and a second flow.

The first flow moves to block B1105, where an image-forming device wirelessly supplies power to a sensor-carrying medium. In some embodiments, the image-forming device continuously or intermittently supplies power to the sensor-carrying medium from blocks B1105 to B1195. And, in some embodiments, the image-forming devices discontinues the supply of power (e.g., in block B1115, in block B1135, in block B1167) and does not resume the supply of power through block B1195. Then, in block B1115, the image-forming device establishes communication with the sensor-carrying medium (e.g., with a SoC, with one or more sensors). Next, in block B1125, the image-forming device sends a start message to the sensor-carrying medium. The start message indicates that the sensor-carrying medium should activate its sensors and start to generate sensed data.

The first flow then moves to block B1135, where the image-forming devices starts to convey the sensor-carrying medium on an image-forming path. Then, in block B1145, the image-forming device determines whether the conveyance of the sensor-carrying medium has reached a time marker or a position marker. A time marker is reached when a certain amount of time has elapsed from the start of the conveyance or has elapsed from a previous time marker. For example, the time markers may be set a regular intervals (e.g., 0.5 seconds, 1 second, 2 seconds). A position marker indicates that the sensor-carrying medium (e.g., a leading edge of the sensor-carrying medium) has reached a respective position on the image-forming path.

If the image-forming device determines that the conveyance of the sensor-carrying medium has reached a time marker or a position marker (B1145=Yes), then the first flow proceeds to block B1155, where the image-forming device sends a time message or a position message to the sensor-carrying medium. A time message indicates a certain time (e.g., an absolute time, a lapsed time since a previous message), and a position message indicates a certain position. The first flow then moves to block B1165. Also, if the image-forming device determines that the conveyance of the sensor-carrying medium has not reached a time marker or a position marker (B1145=No), then the first flow proceeds from block B1145 to block B1165.

In block B1165, the image-forming device determines if the sensor-carrying medium has reached the end of the image-forming path. If the image-forming device determines that the sensor-carrying medium has not reached the end of the image-forming path (B1165=No), then the first flow advances to block B1167, where the image-forming device continues to convey the sensor-carrying medium on the image forming path. The first flow then returns to block B1145.

If the image-forming device determines that the sensor-carrying medium has reached the end of the image-forming path (B1165=Yes), then the first flow advances to block B1175. In block B1175, the image-forming device sends a stop message to the sensor-carrying medium. The stop message may also include a time message or a position message.

The first flow then proceeds to block B1185, where the image-forming device sends a request for sensed data to the sensor-carrying medium. In block B1187, the image-forming device receives sensed data from the sensor-carrying medium, and then the first flow ends in block B1195.

Also, in some embodiments, one or more of blocks B1105, B1115, B1125, B1145, B1155, B1175, B1185, and B1187 are performed by a sensor-communication device. Additionally, in some embodiments, in block B1135 the image-forming device starts conveying the sensor-carrying medium on the image-forming path in response to receiving a message (e.g., an instruction) from a sensor-communication device.

From block B1100, the second flow moves to block B1110, where the sensor-carrying medium receives power. In some embodiments, the sensor-carrying medium continuously receives wireless power from blocks B1110 to B1195. And, in some embodiments, the sensor-carrying medium receives wireless power only part of the time (e.g., intermittently, during an initial period of time) from blocks B1110 to B1195, uses the wireless power to charge one or more batteries, and operates using the power from the batteries when the sensor-carrying medium is not receiving the wireless power.

Then, in block B1120, the sensor-carrying medium establishes communication with the image-forming device (or a sensor-communication device). Next, in block B1130, the sensor-carrying medium determines whether it has received a start message from an image-forming device (or from a sensor-communication device). If the sensor-carrying medium determines that it has not received a start message from the image-forming device (or from a sensor-communication device) (B1130=No), then the second flow returns to block B1130, and the sensor-carrying medium continues to wait for a start message. If the sensor-carrying medium determines that it has received a start message from the image-forming device (or from a sensor-communication device) (B1130=Yes), then the second flow proceeds to block B1140.

In block B1140, the sensor-carrying medium starts to generate sensed data. The second flow then advances to block B1150, where the sensor-carrying medium determines if it has received a time message or a position message. If the sensor-carrying medium determines that it has received a time message or a position message (B1150=Yes), then the second flow moves to block B1152, where the sensor-carrying medium adds time data or position data to the sensed data. The second flow then advances to block B1160. Also, if the sensor-carrying medium determines that it has not received a time message or a position message (B1150=No), then the second flow moves to block B1160.

In block B1160, the sensor-carrying medium determines whether it has received a stop message. If the sensor-carrying medium determines that it has not received a stop message (B1160=No), then the second flow proceeds to block B1162, where the sensor-carrying medium continues to generate sensed data, and then returns to block 1150. If the sensor-carrying medium determines that it has received a stop message (B1160=Yes), then the second flow advances to block B1170, where the sensor-carrying medium stops generating sensed data.

Next, in block B1180, the sensor-carrying medium determines whether it has received a request from the image-forming device (or a sensor-communication device) for the sensed data. If the sensor-carrying medium determines that it has not received a request for the sensed data (B1180=No), then the second flow returns to block B1180, and the sensor-carrying medium continues to wait for a request for the sensed data. If the sensor-carrying medium determines that it has received a request for the sensed data (B1180=Yes), then the second flow moves to block B1190. In block B1190, the sensor-carrying medium transmits sensed data to the image-forming device (or a sensor-communication device). The second flow then ends in block B1195.

Figure 12:
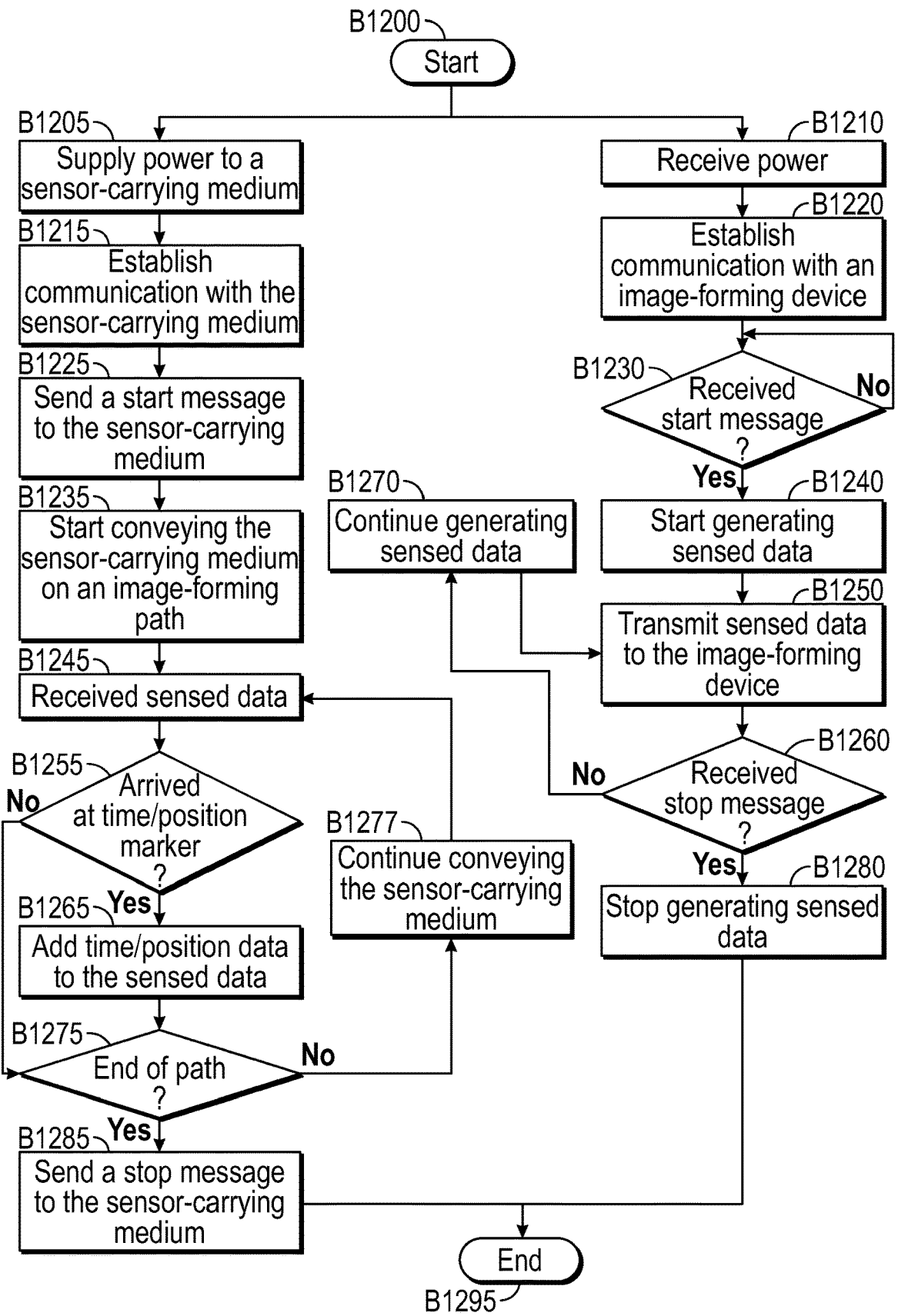
FIG. 12 illustrates an example embodiment of an operational flow for obtaining sensor data.

FIG. 12 illustrates an example embodiment of an operational flow for obtaining sensor data. The flow starts in block B1200 and then splits into a first flow and a second flow.

The first flow moves to block B1205, where an image-forming device wirelessly supplies power to a sensor-carrying medium. In some embodiments, the image-forming device continuously or intermittently supplies power to the sensor-carrying medium from blocks B1205 to B1295. And, in some embodiments, the image-forming devices discontinues the supply of power (e.g., in block B1215, in block B1235, in block B1277) and does not resume the supply of power through block B1295. Then, in block B1215, the image-forming device establishes communication with the sensor-carrying medium (e.g., with a SoC, with one or more sensors). Next, in block B1225, the image-forming device sends a start message to the sensor-carrying medium. The start message indicates that the sensor-carrying medium should activate its sensors and generate sensed data. The first flow then moves to block B1235, where the image-forming devices starts to convey the sensor-carrying medium on an image-forming path. Then, in block B1245, the image-forming device receives sensed data from the sensor-carrying medium.

Next, in block B1255, the image-forming device determines whether the conveyance of the sensor-carrying medium has arrived at a time marker or a position marker. If the image-forming device determines that the conveyance of the sensor-carrying medium has reached a time marker or a position marker (B1255=Yes), then the first flow proceeds to block B1265, where the image-forming device adds time data or position data to the sensed data. The time data indicate a certain time (e.g., an absolute time, a lapsed time since a previous message), and the position data indicate a certain position. The first flow then moves to block B1275. Also, if the image-forming device determines that the conveyance of the sensor-carrying medium has not reached a time marker or a position marker (B1255=No), then the first flow proceeds from block B1255 to block B1275.

In block B1275, the image-forming device determines if the sensor-carrying medium has reached the end of the image-forming path. If the image-forming device determines that the sensor-carrying medium has not reached the end of the image-forming path (B1275=No), then the first flow advances to block B1277, where the image-forming device continues to convey the sensor-carrying medium on the image forming path. The first flow then returns to block B1245.

If the image-forming device determines that the sensor-carrying medium has reached the end of the image-forming path (B1275=Yes), then the first flow advances to block B1285. In block B1285, the image-forming device sends a stop message to the sensor-carrying medium, and then the first flow ends in block B1295.

Also, in some embodiments, one or more of blocks B1205, B1215, B1225, B1245, B1255, B1265, and B1285 are performed by a sensor-communication device. Additionally, in some embodiments, in block B1235 the image-forming device starts conveying the sensor-carrying medium on the image-forming path in response to receiving a message (e.g., an instruction) from a sensor-communication device.

From block B1200, the second flow moves to block B1210, where the sensor-carrying medium receives power. In some embodiments, the sensor-carrying medium continuously receives wireless power from blocks B1210 to B1295. And, in some embodiments, the sensor-carrying medium receives wireless power only part of the time (e.g., intermittently, during an initial period of time) from blocks B1210 to B1295, uses the wireless power to charge one or more batteries, and operates using the power from the batteries when the sensor-carrying medium is not receiving the wireless power.

Then, in block B1220, the sensor-carrying medium establishes communication with the image-forming device (or a sensor-communication device). Next, in block B1230, the sensor-carrying medium determines whether it has received a start message from an image-forming device (or from a sensor-communication device). If the sensor-carrying medium determines that it has not received a start message from the image-forming device (or from a sensor-communication device) (B1230=No), then the second flow returns to block B1230, and the sensor-carrying medium continues to wait for a start message. If the sensor-carrying medium determines that it has received a start message from the image-forming device (or from a sensor-communication device) (B1230=Yes), then the second flow proceeds to block B1240.

In block B1240, the sensor-carrying medium starts to generate sensed data. The second flow then advances to block B1250, where the sensor-carrying medium transmits sensed data to the image-forming device (or a sensor-communication device).

Next, in block B1260, the sensor-carrying medium determines whether it has received a stop message. If the sensor-carrying medium determines that it has not received a stop message (B1260=No), then the second flow proceeds to block B1270, where the sensor-carrying medium continues to generate sensed data, and then returns to block 1250. If the sensor-carrying medium determines that it has received a stop message (B1260=Yes), then the second flow advances to block B1280, where the sensor-carrying medium stops generating sensed data. The second flow then ends in block B1295.

Figure 13:
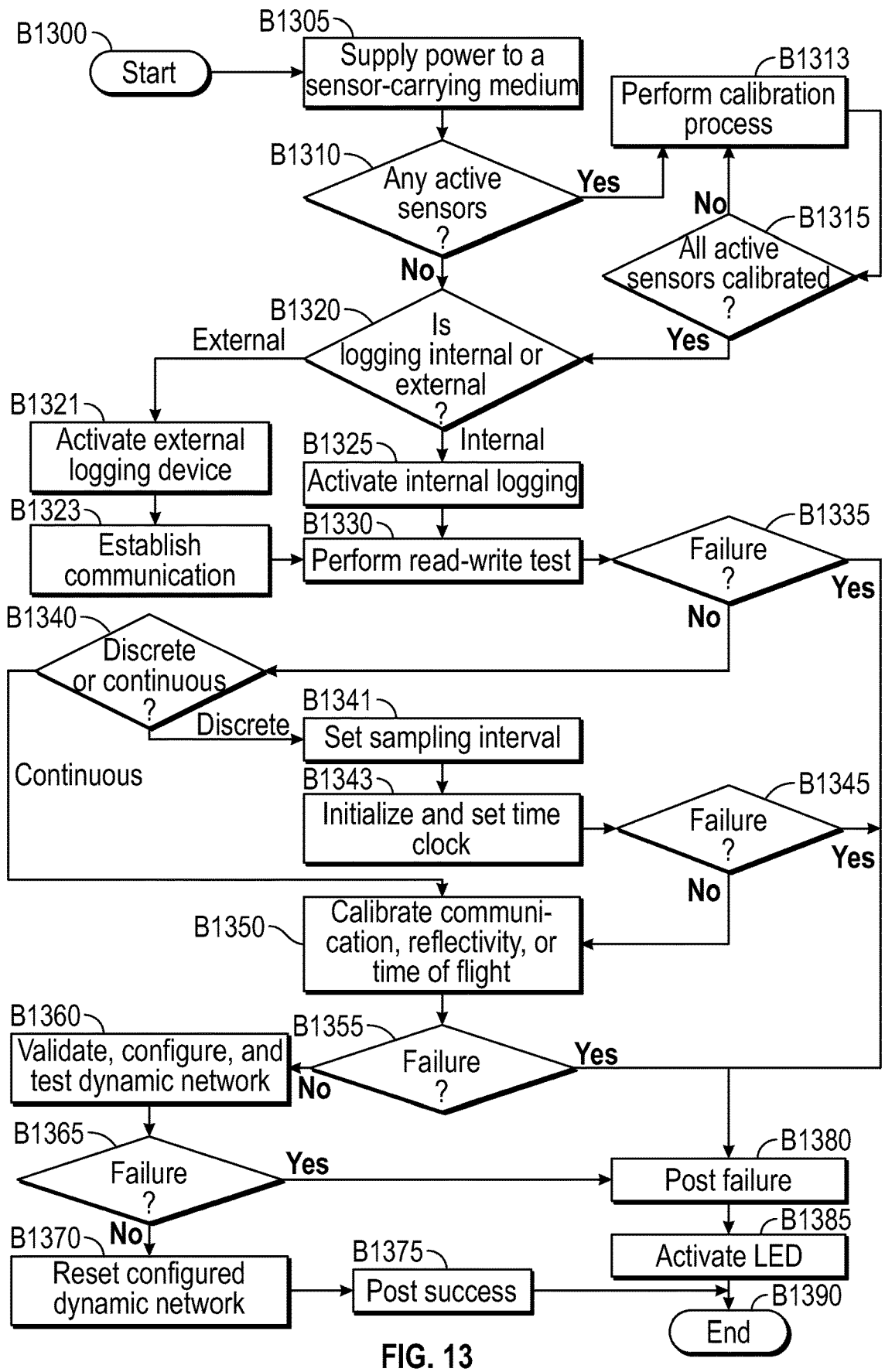
FIG. 13 illustrates an example embodiment of an operational flow for initializing sensors on a sensor-carrying medium.

FIG. 13 illustrates an example embodiment of an operational flow for initializing sensors on a sensor-carrying medium. The flow starts in block B1300 and then moves to B1305, where an image-forming device wirelessly supplies power to a sensor-carrying medium. Next, in block B1310, the sensor-carrying medium determines if any of the sensors are active sensors (instead of passive sensors). For example, some acceleration sensors and gyroscopic sensors are active sensors. If some of the sensors are active sensors (B1310=Yes), then the flow moves to block B1313, where the sensor-carrying medium performs a calibration process for the active sensors. The flow then moves to block B1315, where the sensor-carrying medium determines whether all active sensors have been calibrated. If some of the active sensors have not been calibrated (B1315=No), then the flow returns to block B1313. If all of the active sensors have been calibrated (B1315=Yes), then the flow moves to block B1320.

Also, if in block B1310 none of the sensors are active sensors (B1310=No), then the flow moves to block B1320.

In block B1320, the sensor-carrying medium determines whether the data logging is internal or external. If the data logging is external (B1320=External), then the flow moves to block B1321. For example, the data logging is external if an image-forming device or a sensor-communication device logs the sensor data. If the data logging is internal (B1320=Internal), then the flow proceeds to block B1325.

In block B1321, the external logging device (e.g., an image-forming device, a sensor-communication device) is activated (if it is not already activated). Then, in block B1323, the sensor-carrying medium establishes communication with the external logging device, and the flow then moves to block B1330.

In block B1325, the sensor-carrying medium activates its internal logging, and the flow then advances to block B1330.

In block B1330, the sensor-carrying medium causes the logging device (either internal or external) to perform a read-write test. Next, in block B1335, the sensor-carrying medium determines whether the read write test failed. If the test did not fail (B1335=No), then the flow proceeds to block B1340. If the test did fail (B1335=Yes), then the flow moves to block B1380.

In block B1340, the sensor-carrying medium determines whether the sensor data is generated discretely or continuously. If it is generated discretely (B1340=Discrete), then the flow moves to block B1341. If it is generated continuously (B1340=Continuous), then the flow advances to block B1350.

In block B1341, the sensor-carrying medium sets the sampling interval. For example, the sampling interval may be the same for all sensors, some sensors may have the same interval and some sensors may have different intervals, or all of the sensors may have different intervals. Then, in block B1343, the sensor-carrying medium initializes and sets (e.g., synchronizes) a time clock. Next, in block B1345, the sensor-carrying medium determines whether the operations in blocks B1341 and B1343 failed. If they did not fail (B1345=No), then the flow proceeds to block B1350. If they did fail (B1345=Yes), then the flow moves to block B1380.

In block B1350, the sensor-carrying medium calibrates the communication (e.g., omnidirectional communication) between the sensors; calibrates the sensors to account (e.g., compensate) for reflectivity, diffraction, and scattering; and calibrates the time of flight for any sensors whose reading are affected by time of flight. The flow then advances to block B1355, where the sensor-carrying medium determines whether the operations in block B1350 failed. If they did not fail (B1350=No), then the flow proceeds to block B1360. If they did fail (B1350=Yes), then the flow moves to block B1380.

In block B1360, the sensor-carrying medium validates, configures, and tests a dynamic network (e.g., an ad hoc network) between the sensors. This may include reconfiguring the dynamic network. The flow then advances to block B1365, where the sensor-carrying medium determines whether the operations in block B1360 failed. If they did not fail (B1365=No), then the flow proceeds to block B1370. If they did fail (B1365=Yes), then the flow moves to block B1380.

In block B1370, the sensor-carrying medium resets the configured dynamic network. Then, in block B1375, the sensor-carrying medium posts a success message (e.g., to an image-forming device, to a sensor-communication device), and the flow ends in block B1390.

In block B1380, the sensor-carrying medium posts a failure message (e.g., to an image-forming device, to a sensor-communication device). Then, in block B1385, the sensor-carrying medium activates one of more LEDs of the sensor-carrying medium. The color or light-emitting pattern of the one or more LEDs may indicate the cause of the failure that was posted in B1380. The flow then ends in block B1390.

Figure 14:
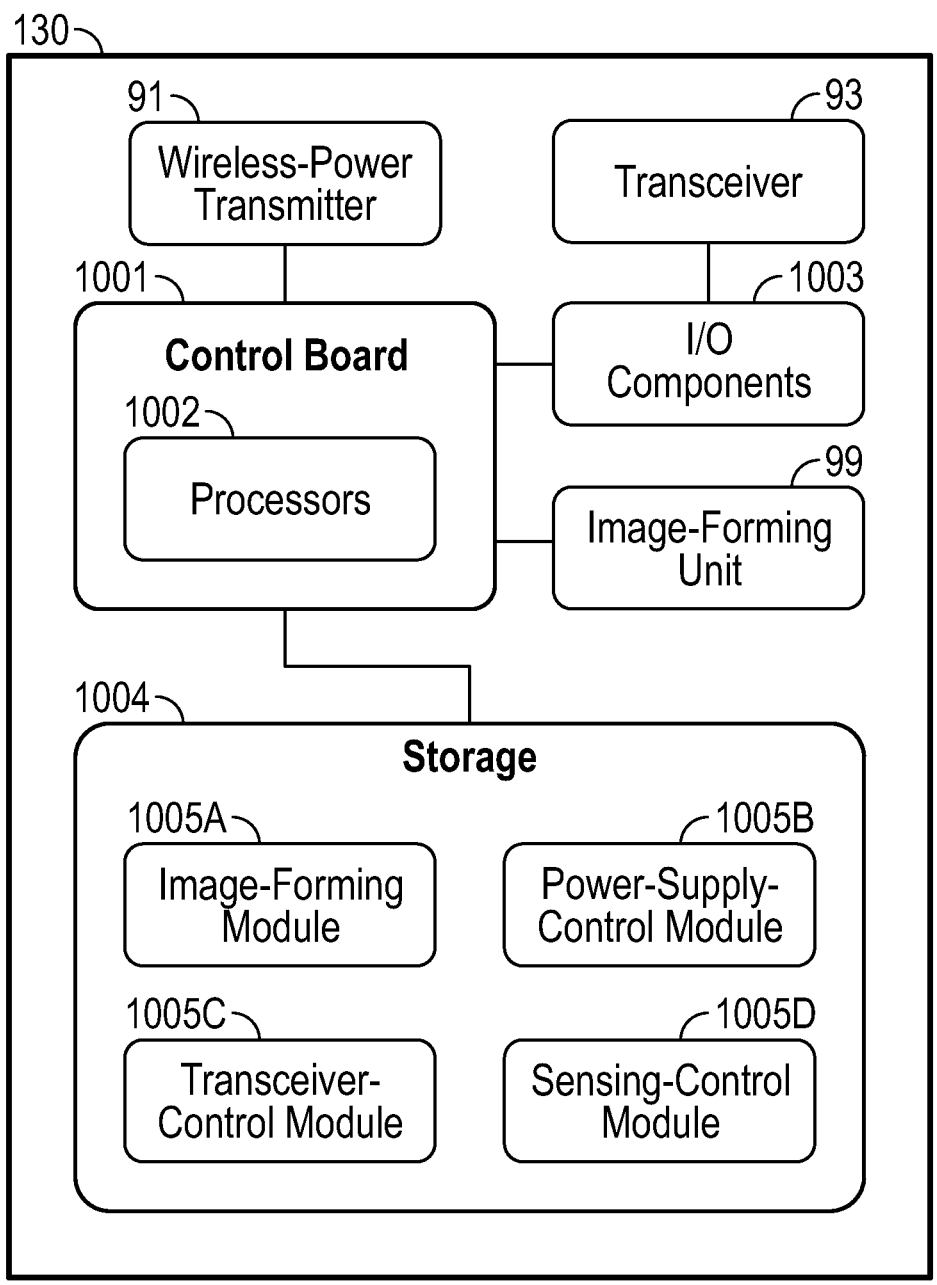
FIG. 14 illustrates an example embodiment of an image-forming device.

FIG. 14 illustrates an example embodiment of an image-forming device. The image-forming device 100 includes a wireless-power transmitter 91, a transceiver 93, an image-forming unit 99, a control board 1001, one or more processors 1002, I/O components 1003, and storage 1004.

The one or more processors 1002 include one or more central processing units (CPUs), which may include one or more microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits).

The I/O components 1003 include communication components (e.g., a graphics card, a network-interface controller) that communicate with one or more computing devices (e.g., desktop computers, laptop computers, servers, tablet computers, smartphones), one or more networks, and input or output devices (not illustrated), which may include a display device, a keyboard, a mouse, a touch screen, a light pen, an optical-storage device, a scanner, a microphone, and a drive, for example. The I/O components 1003 include components that allow the one or more processors to communicate with the transceiver 93.

The storage 1004 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 1004, which may include both ROM and RAM, can store computer-readable data or computer-executable instructions.

The image-forming device 100 also includes some modules 1005: an image-forming module 1005A, a power-supply-control module 1005B, a transceiver-control module 1005C, and a sensing-control module 1005D. A module 1005 includes logic, computer-readable data, or computer-executable instructions. In the embodiment shown in FIG. 14, the modules 1005 are implemented in software (e.g., Assembly, C, C++, C#, Java, BASIC, Perl, Visual Basic, Python). However, in some embodiments, the modules 1005 are implemented in hardware (e.g., customized circuitry) or, alternatively, a combination of software and hardware. When the modules 1005 are implemented, at least in part, in software, then the software can be stored in the storage 1004. Also, in some embodiments, the image-forming device 100 includes additional or fewer modules 1005, the modules 1005 are combined into fewer modules 1005, or the modules 1005 are divided into more modules 1005.

The image-forming module 1005A includes instructions that cause the image-forming device 100 to perform an image-forming operation (e.g., apply ink or toner to a printing medium) or a medium-conveying process that convey a medium along an image-forming path without applying any ink or toner. For example, some embodiments of the image-forming module 1005A include instructions that cause the image-forming device 100 to perform at least some of the operations that are described in block B815 in FIG. 8; in block B925 in FIG. 9; in block B1025 in FIG. 10; in blocks B1135, B1145, B1165, and B1167 in FIG. 11; or in blocks B1235, B1275, and B1277 in FIG. 12.

The power-supply-control module 1005B includes instructions that cause the image-forming device 100 to control the wireless-power transmitter 91 to start supplying power or to stop supplying power. For example, some embodiments of the power-supply-control module 1005B include instructions that cause the image-forming device 100 to perform at least some of the operations that are described in block B805 in FIG. 8, in block B905 in FIG. 9, in blocks B1005 and B1055 in FIG. 10, in block B1105 in FIG. 11, or in block B1205 in FIG. 12.

The transceiver-control module 1005C includes instructions that cause the image-forming device 100 to control the transceiver 93 to communicate (e.g., send data, receive data) with a sensor-carrying medium. For example, some embodiments of the transceiver-control module 1005C include instructions that cause the image-forming device 100 to perform at least some of the operations that are described in block B825 in FIG. 8; in blocks B915, B935, and B945 in FIG. 9; in blocks B1015 and B1035 in FIG. 10; in blocks B1115, B1125, B1175, B1185, and B1187 in FIG. 11; or in blocks B1215, B1225, B1245, and B1285 in FIG. 12.

The sensing-control module 1005D includes instructions that cause the image-forming device 100 to control (e.g., coordinate) the operations that are performed to obtain sensed data from a sensor-carrying medium. For example, some embodiments of the sensing-control module 1005D include instructions that cause the image-forming device 100 to perform at least some of the operations that are described in blocks B1145 and B1155 in FIG. 11 or in blocks B1255 and B1265 in FIG. 12. Also, the sensing-control module 1005D may call the image-forming module 1005A, the power-supply-control module 1005B, and the transceiver-control module 1005C.

Figure 15:
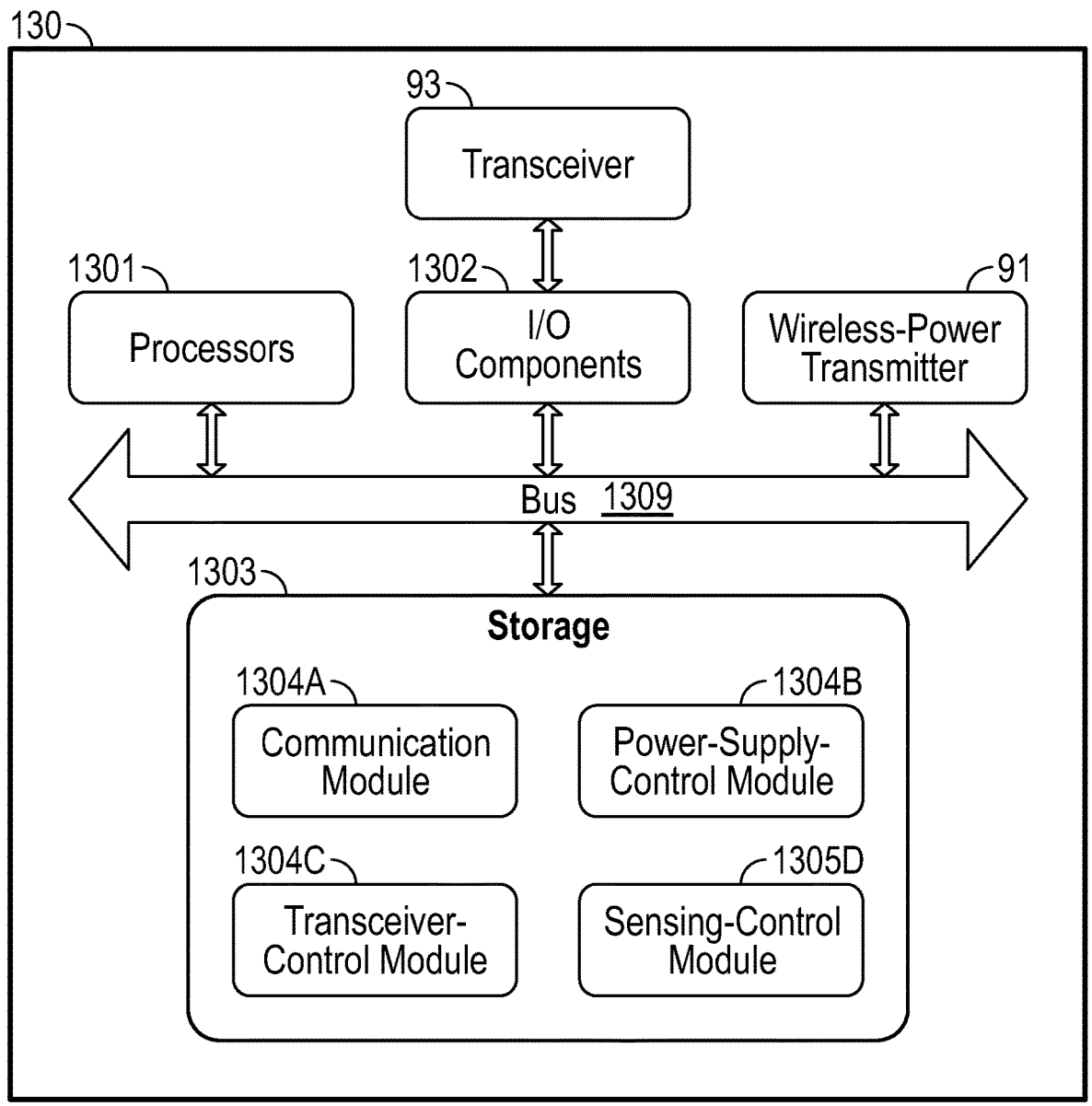
FIG. 15 illustrates an example embodiment of a sensor-communication device.

FIG. 15 illustrates an example embodiment of a sensor-communication device. The sensor-communication device 130 includes one or more processors 1301, I/O components 1302, storage 1303, a wireless-power transmitter 91, a transceiver 93, and a bus 1309.

The sensor-communication device 130 also includes some modules 1304: a communication module 1304A, a power-supply-control module 1304B, a transceiver-control module 1304C, and a sensing-control module 1304D. The communication module 1304A includes instructions that cause the sensor-communication device 130 to communicate with other devices, such as an image-forming device. For example, some embodiments of the communication module 1304A include instructions that cause the sensor-communication device 130 to send a start message (to request a start of an image-forming process) to an image-forming device.

Figure 16:
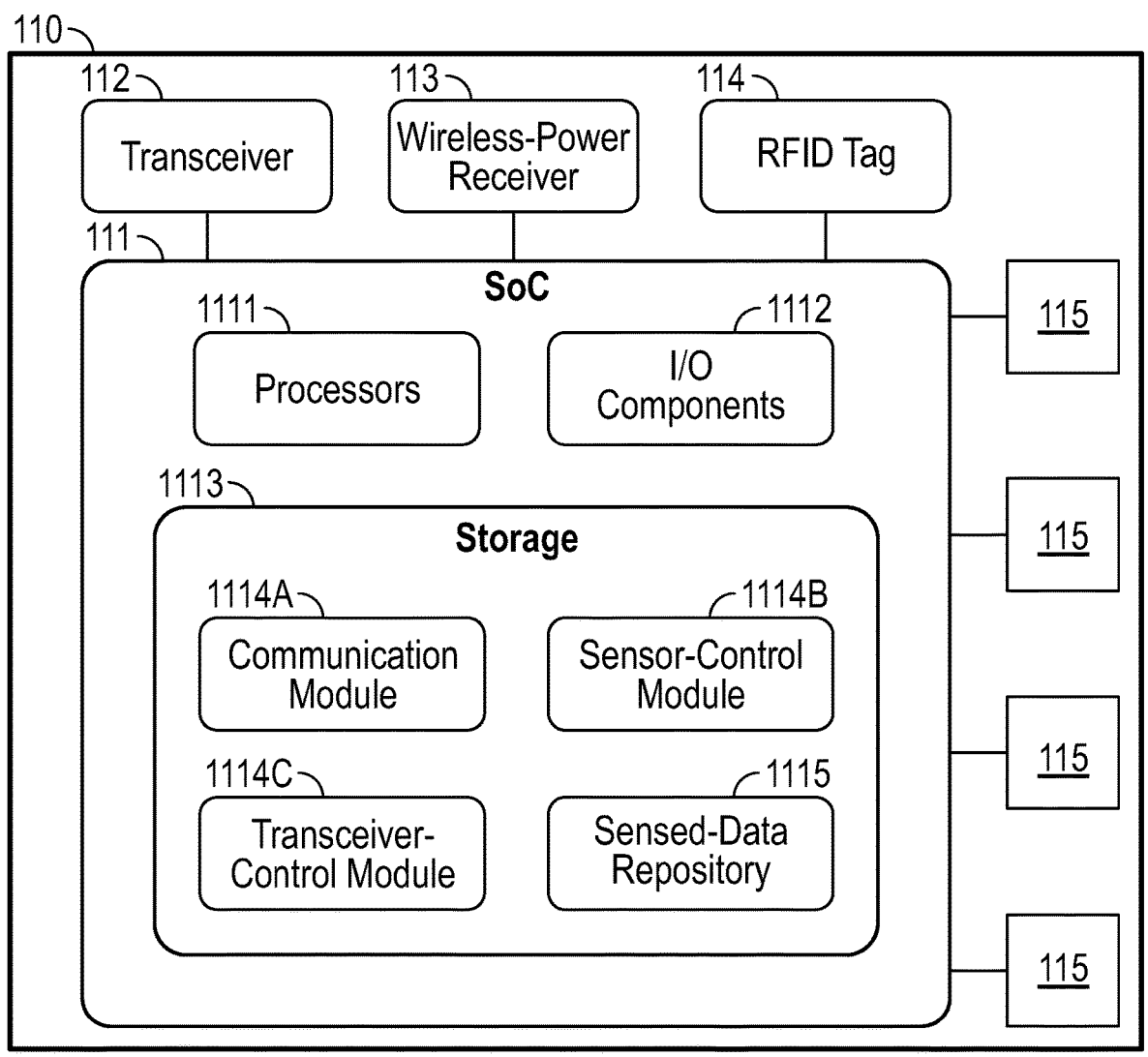
FIG. 16 illustrates an example embodiment of a sensor-carrying medium.

FIG. 16 illustrates an example embodiment of a sensor-carrying medium. The sensor-carrying medium 110 includes a SoC 111, a transceiver 112, a wireless-power receiver 113, an RFID tag 114, and some sensors 115. The SoC 111 includes one or more processors 1111, I/O components 1112, and applicable storage 1113 (storage that can be implemented in the sensor-carrying medium). The storage 1113 includes a sensed-data repository 1115, which stores sensed data. The wireless-power receiver 113 may automatically activate when wireless power is being supplied.

The SoC 111 also includes the following modules 1114: a communication module 1114A, a sensor-control module 1114B, and a transceiver-control module 1114C.

The communication module 1114A includes instructions that cause the sensor-carrying medium 110 to communicate with other devices, such as an image-forming device or a sensor-communication device. For example, some embodiments of the communication module 1304A include instructions that cause the sensor-carrying medium 110 to perform at least some of the operations that are described in block B830 in FIG. 8; in blocks B920, B940, and B950 in FIG. 9; in blocks B1020, B1030, and B1040 in FIG. 10; in blocks B1120, B1130, B1150, B1160, B1180, and B1190 in FIG. 11; or in blocks B1220, B1230, B1250, and B1260 in FIG. 12.

The sensor-control module 1114B includes instructions that cause the sensor-carrying medium 110 to activate the sensors 115 and generate sensed data. For example, some embodiments of the sensor-control module 1114B include instructions that cause the sensor-carrying medium 110 to perform at least some of the operations that are described in block B820 in FIG. 8; in block B930 in FIG. 9; in block B1030 in FIG. 10; in blocks B1140, B1162, and B1170 in FIG. 11; in blocks B1240 and B1270 in FIG. 12; or in blocks B1310 to B1390 in FIG. 13.

What is claimed is:
1. A device comprising:
   an image-forming medium;
   a transmitter that is attached to the image-forming medium; and
   one or more sensors that are attached to the image-forming medium, wherein the image-forming medium, the transmitter, and the one or more sensors are configured to travel along an image-forming path through an image-forming apparatus, wherein the one or more sensors are configured to generate sensed data while traveling along the image-forming path, and wherein the transmitter is configured to obtain the sensed data and transmit the sensed data to another device.

2. The device of claim 1, wherein the image-forming medium is paper.

3. The device of claim 1, wherein at least some of the one or more sensors are microelectromechanical systems (MEMS).

4. The device of claim 1, further including:
a system-on-a-chip that is in communication with the one or more sensors.

5. The device of claim 4, further including:
a transceiver that is in communication with the system-on-a-chip.

6. The device of claim 1, further including a radio-frequency identification (RFID) tag.

7. The device of claim 1, wherein the one or more sensors are configured to be powered by wireless power transfer.

8. The device of claim 1, wherein each of the one or more sensors is no thicker than 0.5 mm.

9. The device of claim 1, further comprising:
at least one memory that is attached to the image-forming medium; and
at least one processor that is attached to the image-forming medium, wherein the at least one processor and the at least one memory are configured to travel along the image-forming path, and wherein the at least one processor and the at least one memory are configured to cooperate to:
obtain the sensed data from the one or more sensors, and
control the transmitter to send the sensed data to the other device.

10. The device of claim 9, further comprising:
a transceiver, wherein the transceiver includes the transmitter, and
wherein the at least one processor and the at least one memory are further configured to cooperate to:
while traveling along the image-forming path, receive, via the transceiver, time data that indicate a plurality of times;
while traveling along the image-forming path, add respective data indicating respective times, of the plurality of times, to corresponding sensed data of the sensed data, wherein each time of the respective times indicates a respective window of time within which the corresponding sensed data were obtained; and
control the transceiver to send the respective data indicating the respective times to the other device with the sensed data.

11. The device of claim 9, wherein the transceiver transmitter, the at least one memory, and at least one processor are all formed on a same substrate.

12. The device of claim 9, wherein the one or more sensors, the transmitter, the at least one memory, and at least one processor are all formed on a same flexible substrate.

13. The device of claim 9, wherein the other device is an image-forming device.

14. The device of claim 1, further comprising:
a wireless-power receiver.

15. The device of claim 1, wherein the one or more sensors include one or more of the following: a temperature sensor, a vibration sensor, a pressure sensor, a gyroscope, a color sensor, a light sensor, a humidity sensor, a chemical sensor, and a voltage sensor.

16. The device of claim 9, wherein the at least one processor and the at least one memory are further configured to cooperate to:
store the sensed data while traveling along the image-forming path; and
control the transmitter to send the stored sensed data to the other device after reaching an end of the image-forming path.

17. The device of claim 9, wherein the at least one processor and the at least one memory are further configured to cooperate to:
control the transmitter to send the sensed data to the other device while traveling along the image-forming path.

18. The device of claim 9, further comprising:
a transceiver, wherein the transceiver includes the transmitter, and
wherein the at least one processor and the at least one memory are further configured to cooperate to:
while traveling along the image-forming path, receive, via the transceiver, position data that indicate a plurality of positions;
while traveling along the image-forming path, add respective data indicating respective positions, of the plurality of positions, to corresponding sensed data of the sensed data, wherein each position of the respective positions indicates a respective position of the image-forming medium on the image-forming path at which the corresponding sensed data were obtained; and
control the transceiver to send the respective data indicating the respective positions to the other device with the sensed data.

19. A device comprising:
a flexible substrate;
a transmitter that is attached to the flexible substrate;
one or more sensors that are attached to the flexible substrate;
at least one memory that is attached to the flexible substrate; and
at least one processor that is attached to the flexible substrate,
wherein the flexible substrate, the transmitter, the one or more sensors, the at least one memory, and the at least one processor are configured to travel along an image-forming path through an image-forming apparatus, and
wherein the at least one processor and the at least one memory are configured to cooperate to
control the one or more sensors to continually or continuously generate sensed data from a commencement of travel along at least part of the image-forming path to an end of travel along the at least part of the image forming path, and
control the transmitter to transmit the sensed data to another device.

* * * * *